United States Patent
Ma et al.

(10) Patent No.: US 12,372,670 B2
(45) Date of Patent: Jul. 29, 2025

(54) X-RAY SCINTILLATORS, METAL HALIDE HYBRIDS, DEVICES, AND METHODS

(71) Applicant: The Florida State University Research Foundation, Inc., Tallahassee, FL (US)

(72) Inventors: Biwu Ma, Tallahassee, FL (US); Liang-Jin Xu, Tallahassee, FL (US); Qingquan He, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 18/752,958

(22) Filed: Jun. 25, 2024

(65) Prior Publication Data

US 2024/0345268 A1 Oct. 17, 2024

Related U.S. Application Data

(63) Continuation of application No. 17/909,611, filed as application No. PCT/US2021/022064 on Mar. 12, 2021, now Pat. No. 12,164,066.

(60) Provisional application No. 62/989,015, filed on Mar. 13, 2020.

(51) Int. Cl.
 *G01T 1/202* (2006.01)
 *G01T 1/20* (2006.01)

(52) U.S. Cl.
 CPC .......... *G01T 1/2023* (2013.01); *G01T 1/2002* (2013.01); *G01T 1/2018* (2013.01)

(58) Field of Classification Search
None
See application file for complete search history.

(56) References Cited

U.S. PATENT DOCUMENTS

2014/0023177 A1   1/2014   Chen et al.
2020/0209414 A1*  7/2020   Birowosuto .............. G01T 1/20

FOREIGN PATENT DOCUMENTS

WO   2018021975 A1   2/2018

OTHER PUBLICATIONS

European Patent Office, International Search Report issued in international application No. PCT/US2021/022064, mailed Jun. 9, 2021, 4 pp.
Jui-Cheng Chang et al., Synthesis and properties of new tetrachlorocobaltate (II) and tetrachloromanganate (II) anion salts with dicationic counterions, Polyhedron, Pergamon Press, Oxford, GB, 30(3), Nov. 9, 2010, pp. 497-507.
Li Zhongyuan et el., Dual-Band Luminescent Lead-Free Antimony Chloride Halides with Near-Unity Photoluminescence Quantum Efficiency, Chemistry of Materials, 31(22), Nov. 26, 2019, pp. 9363-9371.

* cited by examiner

*Primary Examiner* — Edwin C Gunberg
(74) *Attorney, Agent, or Firm* — Eversheds Sutherland (US) LLP

(57) ABSTRACT

Methods of scintillation, scintillation devices, and metal halide hybrids that may be used as X-ray scintillators. The metal halide hybrids may include organic metal halide hybrids, inorganic metal halide hybrids, or organic-inorganic metal halide hybrids. The metal halide hybrids may have a 0D structure. The metal halide hybrids may be in the form of one or more discrete crystals.

18 Claims, 10 Drawing Sheets

X-RAY SCINTILLATORS, METAL HALIDE HYBRIDS, DEVICES, AND METHODS

CROSS-REFERENCE TO RELATED APPLICATIONS

This application is a continuation of U.S. patent application Ser. No. 17/909,611, filed Sep. 6, 2022, which is a U.S. national phase entry of PCT/US2021/022064, filed Mar. 12, 2021, which claims priority to U.S. Provisional Patent Application No. 62/989,015, filed Mar. 13, 2020. The content of these applications is incorporated by reference herein.

STATEMENT REGARDING FEDERALLY SPONSORED RESEARCH OR DEVELOPMENT

This invention was made with government support under contract no. 1709116 awarded by the National Science Foundation, and contract no. 17RT0906 awarded by the Air Force Office of Scientific Research. The government has certain rights in this invention.

BACKGROUND

Scintillators are utilized for X-ray detection in many important fields, e.g., homeland security, health care, etc. Scintillators have the ability to convert ionizing radiation into visible photons, and can be used as radiation detectors for radiation exposure monitoring, security inspection, space exploration, and medical imaging.

X-ray scintillators are scintillation-based indirect detectors, which absorb and down convert high-energy ionizing radiation into ultraviolet-visible light for detection of X-rays. As compared to direct X-ray detectors that convert X-ray to electric current, scintillators can have numerous advantages, such as high response rates, large absorption cross section, and/or high stability.

While various types of materials have been used for X-ray scintillators, there are still many disadvantages associated with existing organic and inorganic scintillation materials. For example, existing organic and inorganic scintillation materials can require rigorous preparation conditions. Other disadvantages include their hygroscopicity, anisotropic scintillation of organic crystals, low light yields in plastics, etc. Most commercially available scintillators are based on inorganic single crystals, which are prepared via time-consuming high temperature processes, which typically must be performed under vacuum. Current scintillators include inorganic crystals, such as CsI(Tl), CsI(Na), CdWO4, YAG(Ce), and LYSO, which typically require high-temperature synthesis techniques, are hygroscopic, or a combination thereof.

To reduce the energy consumption for material preparation, many organic scintillators have been developed with low temperature processes. These materials, however, typically exhibit inferior performance (e.g., lower scintillation light yields and/or resolutions) compared to inorganic scintillators.

Organic-inorganic metal halide perovskites and perovskite-related hybrids have a number of possibly valuable characteristics, such as excellent luminescence properties, high absorption coefficients for ionizing radiation, and solution-process preparations. For instance, methylammonium (MA) lead halide perovskite crystals, $MAPbI_3$ and $MAPbBr_3$, have displayed a light yield of around 1000 photons per MeV (ph $MeV^{-1}$). All inorganic $CsPbBr_3$ nanocrystals have been used to fabricate scintillating panels with good X-ray imaging (see, e.g., Chen, Q. S. et al. *Nature* 2018, 561, 88-93). Another organic lead halide hybrid $(EDBE)PbCl_4$ (EDBE=2,2'-(ethylenedioxy)bis(ethylammonium) cation) was reported to have a light yield of ~9000 ph $MeV^{-1}$ at room temperature (see, e.g., Birowosuto, M. D. et al. *Sci. Rep.* 2016, 6, 37254). While great potential has been shown in these materials, their use in many applications is still limited by the low long-term stability and lead toxicity.

Lead-free low-dimensional metal halide hybrids have been developed to exhibit high luminescence and excellent stability, which make them highly attractive for X-ray scintillators. For example, a lead-free 1D structure $Rb_2CuBr_3$ scintillator has been reported, which has a high light yield (~91000 ph $MeV^{-1}$) and good spectral stability for two months under ambient conditions (Yang, B. et al. *Adv. Mater.* 2019, 31, 1904711). A zero-dimensional (0D) $Bmpip_2SnBr_4$ (Bmpip=1-butyl-1-methyl-piperidinium cation) based scintillator has exhibited a higher scintillation light yield than that of NaI:Tl (Morad, V. et al. *J. Am. Chem. Soc.* 2019, 141, 9764-9768). However, the PLQE (75%) of this material is still not optimal and the easy oxidation of Sn (II) to Sn (IV) makes the material unstable.

Therefore, there remains a need for metal halide hybrids, including highly stable luminescent 0D metal halide hybrids, for scintillators, such as metal halide hybrids that exhibit high light yield and/or stability upon irradiation with high-energy radiation. There also remains a need for scintillation materials, including materials that can be synthesized relatively inexpensively, are eco-friendly (e.g., lead-free, heavy metal-free, etc.), have a high quality crystal structure (e.g., relatively large in size, stable, etc.), have a strong visible emission with high photoluminescence quantum efficiency (PLQE), exhibit a greater light yield than most conventional commercially available scintillators, or a combination thereof.

BRIEF SUMMARY

Provided herein are metal halide hybrids, including 0D metal halide hybrids, that may be used as scintillation materials. The metal halide hybrids provided herein, in some embodiments, are stable, relatively easy to synthesize, eco-friendly, and/or exhibit a desirable light yield, including light yields that exceed many commercially available scintillators. Also provided herein are methods for scintillation and devices.

In one aspect, methods for scintillation are provided. The methods for scintillation, in some embodiments, include irradiating a metal halide hybrid with high-energy radiation to convert the high-energy radiation to at least one of near ultraviolet light or visible light. The metal halide hybrid may have a 0D structure. The high-energy radiation may include X-rays, gamma rays, or a combination thereof. In some embodiments, the methods include irradiating a metal halide hybrid with X-rays at a dose rate of about 10 microGy/s to about 40 microGy/s.

In another aspect, devices, including scintillation devices, are provided. In some embodiments, the methods include a scintillator screen. The scintillator screen may include a metal halide hybrid. In some embodiments, the scintillation devices also include one or more of an electronic substrate, an imaging chip, or a fiber-optic face plate. In some embodiments, the metal halide hybrid has a 0D structure. In some embodiments, the scintillation devices also include a housing in which one or more components of the scintillation devices are arranged. In some embodiments, the imaging chip comprises a complementary metal oxide semiconductor image sensor.

In yet another aspect, metal halide hybrids are provided. In some embodiments, the metal halide hybrids include an organic antimony halide. The organic antimony halide may include a crystal according to Formula (I)—

R$_2$SbX$_5$        Formula (I), wherein X is a halide, and wherein R is an organic ammonium cation. In some embodiments, the metal halide hybrids include an organic manganese (II) halide hybrid. The organic manganese (II) halide hybrid may include a crystal according to Formula (III)—

R'MnX$_4$        Formula (III), wherein X is a halide, and R' is an organic phosphonium cation. In some embodiments, the metal halide hybrids provided herein have a first PLQE measured within one week of the metal halide hybrid's creation, a second PLQE measured after the metal halide hybrid is stored at ambient conditions for at least one year following the metal halide hybrid's creation, and the second PLQE is no more than 3 percentage points less than the first PLQE.

In a still further aspect, scintillation materials are provided herein. The scintillation materials may include a metal halide hybrid. The scintillation materials may include a flexible film.

Other objects, features, and advantages of the invention will be apparent from the following detailed description, drawings, and claims. Unless otherwise defined, all technical and scientific terms and abbreviations used herein have the same meaning as commonly understood by one of ordinary skill in the art to which this invention pertains. Although methods and compositions similar or equivalent to those described herein can be used in the practice of the present invention, suitable methods and compositions are described without intending that any such methods and compositions limit the invention herein.

DETAILED DESCRIPTION

Provided herein are metal halide hybrids, and methods for scintillation and scintillation devices that may include a metal halide hybrid.

Methods for Scintillation

Provided herein are methods for scintillation. In some embodiments, the methods include irradiating a metal halide hybrid with high-energy radiation to convert the high-energy radiation to at least one of near ultraviolet light or visible light. In other words, the high-energy radiation may be converted to near ultraviolet light, visible light, or a combination thereof.

In some embodiments, the high-energy radiation includes X-rays, gamma rays, or a combination thereof. In some embodiments, the high-energy radiation consists of X-rays.

A metal halide hybrid may be irradiated with high-energy radiation at any dose rate. In some embodiments, a metal halide hybrid is irradiated with high-energy radiation, such as X-rays, at a dose rate of about 5 microGy/s to about 100 microGy/s, about 5 microGy/s to about 80 microGy/s, about 10 microGy/s to about 60 microGy/s, or about 10 microGy/s to about 40 microGy/s.

A metal halide hybrid may exhibit a light yield suitable for many applications. In some embodiments, a metal halide hybrid exhibits a light yield of at least 50,000 photons/MeV, at least 60,000 photons/MeV, at least 70,000 photons/MeV, at least 80,000 photons/MeV, or at least 90,000 photons/MeV.

A metal halide hybrid may exhibit a suitable detection limit. In some embodiments, a metal halide hybrid exhibits a detection limit of about 50 nGy/s to about 500 nGy/s, about 50 nGy/s to about 400 nGy/s, about 50 nGy/s to about 300 nGy/s, about 50 nGy/s to about 200 nGy/s, about 60 nGy/s to about 90 nGy/s, or about 65 nGy/s to about 85 nGy/s.

Scintillation Devices

Scintillation devices also are provided herein. In some embodiments, the scintillation devices include a scintillator screen that includes a metal halide hybrid. A scintillator screen "includes" or "comprises" a metal halide hybrid when the metal halide hybrid is disposed on and/or dispersed in the scintillator screen. In some embodiments, the scintillation devices include a scintillator screen and one or more of the following components: an electronic substrate, an imaging chip, and a fiber-optic face plate.

In some embodiments, the scintillation devices include an electronic substrate; an imaging chip; a fiber-optic face plate, wherein the imaging chip is arranged between the electronic substrate and the fiber-optic face plate; and a scintillator screen including a metal halide hybrid, wherein the fiber-optic face plate is arranged between the imaging chip and the scintillator screen.

The scintillation devices also may include a housing. One or more components of the scintillation devices may be arranged in the housing. A component is "arranged in a housing" when all or a portion of the component is at least partially encased by the housing. The housing may be formed of any suitable material(s).

Figure 1A:
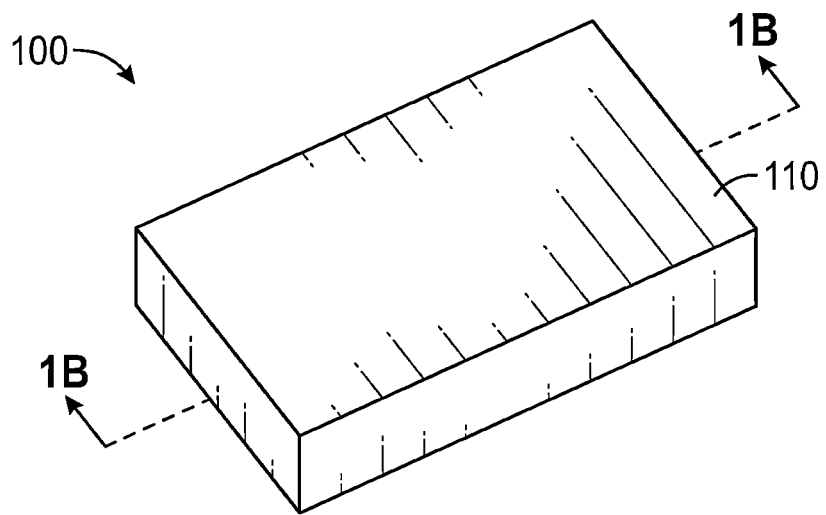
FIG. 1A is a schematic of an embodiment of a scintillator device.
Figure 1B:
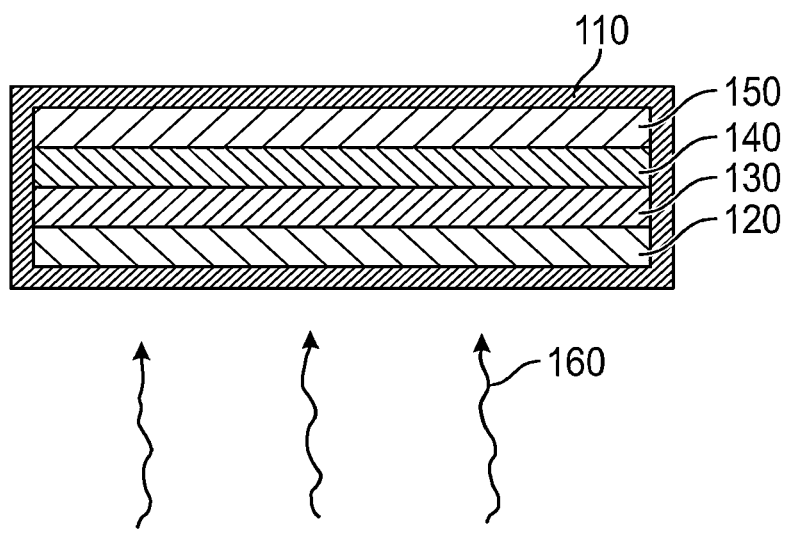
FIG. 1B is a cross-sectional view of the scintillator device of FIG. 1A.

Schematics of an embodiment of a scintillation device are depicted at FIG. 1A and FIG. 1B. The scintillation device 100 includes a housing 110. Within the housing 110, the scintillation device 100 includes a scintillator screen 120, a fiber-optic face plate 130, an imaging chip 140, and an electronic substrate 150. When the scintillation device 100 is used, the device may be oriented so that high-energy radiation 160 contacts the scintillation device 100 in the direction shown.

In some embodiments, the imaging chip includes a complementary metal oxide semiconductor image sensor.

In some embodiments, the metal halide hybrid is in the form of one or more discrete crystals dispersed in and/or arranged on a scintillator screen. In some embodiments, the scintillator screen includes a film, such as a flexible film, as described herein.

Metal Halide Hybrids

Metal halide hybrids are provided herein, including metal halide hybrids that may be used in the methods and/or devices provided herein.

As used herein, the phrase "metal halide hybrid" refers to a compound, such as a crystal, having a formula (e.g., a unit cell formula) that includes one or more metal atoms, one or more halide atoms, and one or more cations. The one or more metal atoms may be the same or different; the one or more halide atoms may the same or different (e.g., a metal mixed halide hybrid); and the one or more cations may be the same or different (e.g., an organic-inorganic metal halide hybrid).

In some embodiments, the metal halide hybrid is an organic metal halide hybrid. As used herein, the phrase "organic metal halide hybrid" refers to a metal halide hybrid that includes one or more organic cations (e.g., an organic ammonium cation), and the one or more organic cations may be the same or different. An "organic cation" is a cation that includes at least one carbon atom, at least one hydrogen atom, and at least one positively charged atom (for example, a positively charged nitrogen atom). In some embodiments, the organic metal halide hybrid is an organic metal mixed halide hybrid, which includes two or more different halide atoms (e.g., $Cl^-$ and $Br^-$; or $Br^-$ and $I^-$; etc.).

In some embodiments, the metal halide hybrid is an inorganic metal halide hybrid. As used herein, the phrase "inorganic metal halide hybrid" refers to a metal halide hybrid that includes one or more inorganic cations (e.g., a cesium atom), and the one or more inorganic cations may be the same or different. An "inorganic cation" is a cation that includes a positively charged atom, and does not include a carbon atom. In some embodiments, the inorganic metal halide hybrid is an inorganic metal mixed halide hybrid, which includes two or more different halide atoms (e.g., $Cl^-$ and $Br^-$; or $Br^-$ and $I^-$; etc.).

In some embodiments, the metal halide hybrid is an organic-inorganic metal halide hybrid. As used herein, the phrase "organic-inorganic metal halide hybrid" refers to a metal halide hybrid that includes at least one organic cation (e.g., an organic ammonium cation) and at least one inorganic cation (e.g., a cesium atom), and the one or more organic cations may be the same or different, and the one or more inorganic cations may be the same or different. In some embodiments, the organic-inorganic metal halide hybrid includes an organic-inorganic metal mixed halide hybrid, which includes two or more different halide atoms (e.g., $Cl^-$ and $Br^-$; or $Br^-$ and $I^-$; etc.).

The metal halide hybrid may have any crystal structure. In some embodiments, the metal halide hybrid has a 0D structure. In some embodiments, the metal halide hybrid has a 1D structure. In some embodiments, the metal halide hybrid has a 2D structure. In some embodiments, the metal halide hybrid has a 3D structure.

In some embodiments, the metal halide hybrid includes one or more metals selected from Sn, In, Sb, Bi, Mn, Hg, Zn, Ge, or a combination thereof.

The halide of a metal halide hybrid may include $F^-$, $Cl^-$, $Br^-$, $I^-$, or a combination thereof.

The metal halide hybrids may include any inorganic cation. In some embodiments, the inorganic cation includes a cesium atom.

The metal halide hybrids may include any organic cation. In some embodiments, the organic cation includes an organic ammonium cation, an organic phosphonium cation, or a combination thereof. Non-limiting examples of organic cations that may appear in the metal halide hybrids herein include those of Formula (IIa), Formula (IIb), and Formula (IV) described herein.

The metal halide hybrids described herein may be in any physical form(s). For example, the metal halide hybrids irradiated with high-energy radiation in the methods described herein and/or the metal halide hybrids included in the scintillator screens of the devices described herein may be in any physical form(s).

In some embodiments, the metal halide hybrid is in the form of one or more discrete crystals. The one or more discrete crystals may be of any size. In some embodiments, the crystals include one or more single crystals having a largest dimension of about 1 mm to about 30 mm, about 1 mm to about 20 mm, about 1 mm to about 15 mm or about 1 mm to about 10 mm. In some embodiments, the metal halide hybrid is in the form of a powder (i.e., a plurality of particles having an average largest dimension less than 1 mm).

The metal halide hybrid may be dispersed in a matrix material. The metal halide hybrid, for example, may be dispersed evenly or unevenly in a matrix material. The matrix material may include one or more polymers, such as polydimethylsiloxane. The matrix material in which the metal halide particles are dispersed may be in the form of a film. The film may be a flexible film. The film, in some embodiments, is a polymeric three-dimensional microstructured film. Any of the films described herein may be used as a scintillator screen in the devices herein.

The metal halide hybrids may be relatively stable. For example, a metal halide hybrid may have (i) a first PLQE measured within one week of the metal halide hybrid's creation, (ii) a second PLQE measured after the metal halide hybrid is stored at ambient conditions for at least one year or at least two years following the metal halide hybrid's creation, and (iii) the second PLQE is no more than 3 percentage points, 2 percentage points, or 1 percentage point less than the first PLQE.

In some embodiments, the metal halide perovskite has a PLQE of at least 95%, at least 96%, at least 97%, at least 98%, or at least 99%.

Non-limiting examples of metal halide hybrids that may be used in the methods and devices disclosed herein are listed at the following table:

| Embodiment of Metal Halide Hybrid | Reference |
|---|---|
| $(C_4N_2H_{14}Br)_4SnBr_6$ | Zhou, C., Chem. Sci. 2018, 9, 586. |
| $(C_4N_2H_{14}I)_4SnI_6$ | Zhou, C., Chem. Sci. 2018, 9, 586. |
| $(C_4H_{14}N_2)_2In_2Br_{10}$ | Zhou, L. Angew. Chem., Int. Ed. 2019, 58, 15435. |
| $(C_6H_5CH_2NH_3)_3InBr_6$ | Chen, D. J. Mater. Chem. C 2020, 8, 7322. |
| $(C_6H_5CH_2NH_3)_3SbBr_6$ | Chen, D. J. Mater. Chem. C 2020, 8, 7322. |
| $(C_6H_5CH_2NH_3)_3BiBr_6$ | Chen, D. J. Mater. Chem. C 2020, 8, 7322. |
| $(C_6H_8N_2O_2)_3SbBr_6$ | Lin, F. J. Mater. Chem. C 2020, 8, 7300. |
| $(C_6N_2H_{16}Cl)_2SnCl_6$ | Song. G. et al. J. Phys. Chem. Lett. 2020, 11, 1808. |
| $[(C_8H_{12}N)_4SnBr_6]$ $[(C_8H_{12}N)Br]_2[CCl_2H_2]_2$ | Xu, L. J. et al. Chem. Mater. 2020, 32, 4692. |
| $(C_{24}H_{20}P)_2SbCl_5$ | Zhou, C. et al. Chem. Mater. 2018, 30, 2374. |
| $(C_{24}H_{20}P)_2MnBr_4$ | Xu, L. J. et al. Adv. Mater. 2017, 29, 1605739. |
| $(C_{11}H_{13}N_2)_2SbCl_5$ | Wang, Z. et al. Angew. Chem., Int. Ed. 2019, 58, 9974. |
| $(C_{11}H_{13}N_2)_3SbCl_6$ | Wang, Z. et al. Angew. Chem., Int. Ed. 2019, 58, 9974. |
| $(C_5H_7N_2)_2HgBr_4 \cdot H_2O$ | Yangui, A. et al. Chem. Mater. 2019, 31, 2983. |
| $(C_5H_7N_2)_2ZnBr_4$ | Yangui, A. et al. Chem. Mater. 2019, 31, 2983. |
| $(C_9NH_{20})_2SnBr_4$ | Zhou, C. et al. Angew. Chem., Int. Ed. 2018, 57, 1021. |
| $(C_{10}H_{22}N)_2SnBr_4$ | Morad, V. et al. J. Am. Chem. Soc. 2019, 141, 9764. |
| $(C_{10}H_{22}N)_2PbBr_4$ | Morad, V. et al. J. Am. Chem. Soc. 2019, 141, 9764. |
| $(C_{10}H_{22}N)_2GeBr_4$ | Morad, V. et al. J. Am. Chem. Soc. 2019, 141, 9764. |
| $(C_{13}H_{19}N_4)_2PbBr_4$ | Lin, H. et al. ACS Mater. Lett. 2019, 1, 594. |

In some embodiments, the metal halide hybrid includes an organic antimony halide. The organic antimony halide may include a crystal according to Formula (I)—

$$R_2SbX_5 \quad \text{Formula (I),}$$

wherein X is a halide, and R is an organic ammonium cation. The organic ammonium cation may include at least one phosphorus atom (e.g., Formula (IIb)).

The organic ammonium cation may have a structure according to Formula (Ia) or Formula (IIb):

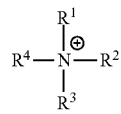

Formula (IIa)

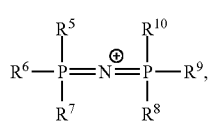

Formula (IIb)

wherein each of $R^1$-$R^{10}$ is independently selected from a substituted or unsubstituted $C_1$-$C_{20}$ hydrocarbyl.

In some embodiments, the organic ammonium cation is a bis(triarylphosphoranylidine) ammonium cation. The bis (triarylphosphoranylidine) ammonium cation may be a bis (triphenyl-phosphoranylidene) ammonium cation.

In some embodiments, the organic ammonium cation is a bis(triarylphosphoranylidine) ammonium cation, and X is $Cl^-$. The bis(triarylphosphoranylidine) ammonium cation may be a bis(triphenyl-phosphoranylidene) ammonium cation, and X is $Cl^-$.

In some embodiments, the metal halide material is a zero-dimensional (0D) organic metal halide hybrid, $(PPN)_2SbCl_5$ (PPN=bis(triphenylphosphoranylidene) ammonium cation), which may be used as an X-ray scintillation material having a high light yield and/or environmental stability. In some embodiments, $(PPN)_2SbCl_5$ single crystals are prepared by solution growth, and exhibit visible photoluminescence with a quantum efficiency of 98.1%. In some embodiments, when excited by X-rays, $(PPN)_2SbCl_5$ single crystals exhibit radioluminescence with a near-perfect linearity in a large range of X-ray dose rate, and a higher light yield (~49500 photons per MeV) than that of a commercial $Lu_{1.8}Y_{0.2}SiO_5$:Ce scintillator (~33200 photons per MeV). In some embodiments, the detection limit of $(PPN)_2SbCl_5$ (191.4 $nGy_{air}$ $s^{-1}$) is much lower than the required value for regular medical diagnostics (5.5 $\mu Gy_{air}$ $s^{-1}$). In some embodiments, $(PPN)_2SbCl_5$ single crystals are provided that exhibit significant stability with little-to-no change of properties after storage in ambient conditions for at least one year, or at least two years.

In some embodiments, the metal halide hybrid is an organic manganese (II) halide hybrid. The organic manganese (II) halide hybrid may include a crystal according to Formula (III)—

$$R'MnX_4 \quad \text{Formula (III),}$$

wherein X is a halide, and R' is an organic phosphonium cation. In some embodiments, the crystal exhibits a green emission peaked at 517 nm.

In some embodiments, the organic phosphonium cation has a structure according to Formula (IV):

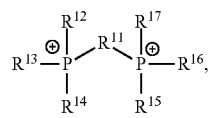

Formula (IV)

wherein each of $R^{11}$-$R^{17}$ is independently selected from a substituted or unsubstituted $C_1$-$C_{20}$ hydrocarbyl.

In some embodiments, the organic phosphonium cation is ethylenebis-triphenyl-phosphonium. In some embodiments, the organic phosphonium cation is ethylenebis-triphenyl-phosphonium, and X is Br.

In some embodiments, the metal halide material is ethylenebis-triphenylphosphonium manganese (II) bromide $((C_{38}H_{34}P_2)MnBr_4)$. In some embodiments, the materials are prepared using a facile solution growth method at room temperature to form inch-sized single crystals. In some embodiments, the organic-inorganic hybrid materials have a zero-dimensional (0D) structure at the molecular level. The materials may exhibit a green emission peaked at 517 nm. The materials may have a photoluminescence quantum efficiency (PLQE) of about 95%. In some embodiments, the characterization of the materials' X-ray scintillation revealed excellent performance with an exceptional linear response to X-ray dose rate, a high light yield of about 80,000 photons/MeV, and a very low detection limit of 72.8 nGy/s. X-ray imaging tests demonstrated that embodiments of scintillators based on $(C_{38}H_{34}P_2)MnBr_4$ powders could provide a visualization tool for X-ray radiography, and high resolution flexible scintillators could be fabricated by blending $(C_{38}H_{34}P_2)MnBr_4$ powders with polydimethylsiloxane (PDMS).

Other embodiments of the methods, devices, and metal halide hybrids provided herein include the following:

Embodiment 1: A method for X-ray scintillation, the method comprising irradiating a metal halide hybrid with high-energy radiation to convert the high-energy radiation to at least one of near ultraviolet light or visible light.

Embodiment 2: The method of Embodiment 1, wherein the metal halide hybrid has a 0D structure.

Embodiment 3: The method of any of the preceding Embodiments, wherein (i) the metal halide hybrid has a first PLQE measured within one week of the metal halide hybrid's creation, (ii) a second PLQE measured after the metal halide hybrid is stored at ambient conditions for at least one year or at least 2 years following the metal halide hybrid's creation, and (iii) the second PLQE is no more than 3 percentage points, 2 percentage points, or 1 percentages points less than the first PLQE.

Embodiment 4: The method of any of the preceding Embodiments, wherein the metal halide hybrid exhibits (i) a light yield of at least 50,000 photons/MeV, at least 60,000 photons/MeV, at least 70,000 photons/MeV, or about 70,000 photons/MeV to about 90,000 photons/MeV, (ii) a detection limit of about 50 nGy/s to about 500 nGy/s, or (iii) a combination thereof.

Embodiment 5: The method of any of the preceding Embodiments, wherein the metal halide hybrid is in the form of one or more discrete crystals.

Embodiment 6: The method of any of the preceding Embodiments, wherein each of the one or more discrete crystals has a largest dimension of about 1 mm to about 10 mm.

Embodiment 7: The method of any of the preceding Embodiments, wherein the metal halide hybrid is dispersed in a matrix material.

Embodiment 8: The method of any of the preceding Embodiments, wherein the metal halide hybrid is in the form of a powder.

Embodiment 9: The method of any of the preceding Embodiments, wherein the matrix material comprises a polymer.

Embodiment 10: The method of any of the preceding Embodiments, wherein the polymer comprises polydimethylsiloxane.

Embodiment 11: The method of any of the preceding Embodiments, wherein the matrix material is in the form of a film.

Embodiment 12: The method of any of the preceding Embodiments, wherein the film is a flexible film.

Embodiment 13: The method of any of the preceding Embodiments, wherein the film comprises a polymeric three-dimensional microstructured film.

Embodiment 14: The method of any of the preceding Embodiments, wherein the high-energy radiation comprises X-rays, gamma rays, or a combination thereof.

Embodiment 15: The method of any of the preceding Embodiments, wherein the high-energy radiation comprises X-rays, and the metal halide hybrid is irradiated with the X-rays at a dose rate of about 5 microGy/s to about 100 microGy/s, about 5 microGy/s to about 80 microGy/s, about 10 microGy/s to about 60 microGy/s, or about 10 microGy/s to about 40 microGy/s.

Embodiment 16: A device comprising an electronic substrate; an imaging chip; a fiber-optic face plate, wherein the imaging chip is arranged between the electronic substrate and the fiber-optic face plate; and a scintillator screen comprising a metal halide hybrid, wherein the fiber-optic face plate is arranged between the imaging chip and the scintillator screen.

Embodiment 17: The device of any of the preceding Embodiments, wherein the metal halide hybrid has a 0D structure.

Embodiment 18: The device of any of the preceding Embodiments, further comprising a housing in which the electronic substrate, the imaging chip, the fiber-optic face plate, and the scintillator screen are arranged.

Embodiment 19: The device of any of the preceding Embodiments, wherein the imaging chip comprises a complementary metal oxide semiconductor image sensor.

Embodiment 20: The device of any of the preceding Embodiments, wherein the metal halide hybrid is in the form of one or more discrete crystals dispersed in the scintillator screen, arranged on the scintillator screen, or a combination thereof.

Embodiment 21: The device of any of the preceding Embodiments, wherein the scintillator screen further comprises a matrix material in which the metal halide hybrid is dispersed.

Embodiment 22: The device of any of the preceding Embodiments, wherein the scintillator screen is a flexible film.

Embodiment 23: The method or device of any of the preceding Embodiments, wherein the metal halide hybrid comprises an organic metal halide hybrid.

Embodiment 24: The method or device of any of the preceding Embodiments, wherein the organic metal halide hybrid comprises an organic metal mixed halide hybrid.

Embodiment 25: The method or device of any of the preceding Embodiments, wherein the metal halide hybrid comprises an inorganic metal halide hybrid.

Embodiment 26: The method or device of any of the preceding Embodiments, wherein the inorganic metal halide hybrid comprises an inorganic metal mixed halide hybrid.

Embodiment 27: The method or device of any of the preceding Embodiments, wherein the metal halide hybrid comprises an organic-inorganic metal halide hybrid.

Embodiment 28: The method or device of any of the preceding Embodiments, wherein the organic-inorganic metal halide hybrid comprises an organic-inorganic metal mixed halide hybrid.

Embodiment 29: The method or device of any of the preceding Embodiments, wherein the metal halide hybrid comprises a metal selected from the group consisting of Sn, In, Sb, Bi, Mn, Hg, Zn, and Ge.

Embodiment 30: The method or device of any of the preceding Embodiments, wherein the halide comprises $F^-$, $Cl^-$, $Br^-$, $I^-$, or a combination thereof.

Embodiment 31: The method or device of any of the preceding Embodiments, wherein the metal halide hybrid comprises an inorganic cation comprising cesium.

Embodiment 32: The method or device of any of the preceding Embodiments, wherein the metal halide hybrid comprises an organic cation selected from the group consisting of an ammonium cation and a phosphonium cation.

Embodiment 33: The method or device of any of the preceding Embodiments, wherein the metal halide hybrid comprises an organic antimony halide comprising a crystal according to Formula (I)—$R_2SbX_5$ Formula (I), wherein X is a halide, and wherein R is an organic ammonium cation.

Embodiment 34: The method or device of any of the preceding Embodiments, wherein the metal halide hybrid comprises an organic manganese (II) halide hybrid comprising a crystal according to Formula (III)—R'MnX$_4$ Formula (III), wherein X is a halide, and R' is an organic phosphonium cation.

Embodiment 35: An organic antimony halide comprising a crystal according to Formula (I)—R$_2$SbX$_5$ Formula (I), wherein X is a halide, and wherein R is an organic ammonium cation.

Embodiment 36: The organic antimony halide of any of the preceding Embodiments, wherein the organic ammonium cation has a structure according to formula (IIa) or formula (IIb):

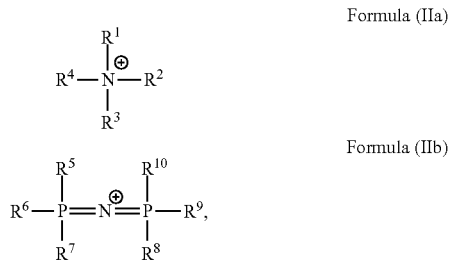

wherein each of R$^1$-R$^{10}$ is independently selected from a substituted or unsubstituted C$_1$-C$_{20}$ hydrocarbyl.

Embodiment 37: The organic antimony halide of any of the preceding Embodiments, wherein the organic ammonium cation comprises at least one phosphorus atom.

Embodiment 38: The organic antimony halide of any of the preceding Embodiments, wherein the organic ammonium cation is a bis(triarylphosphoranylidine) ammonium cation.

Embodiment 39: The organic antimony halide of any of the preceding Embodiments, wherein the bis(triarylphosphoranylidine) ammonium cation is bis(triphenylphosphoranylidene) ammonium cation.

Embodiment 40: The organic antimony halide of any of the preceding Embodiments, wherein X is Cl.

Embodiment 41: The organic antimony halide of any of the preceding Embodiments, wherein the crystal has a 0D structure.

Embodiment 42: The organic antimony halide of any of the preceding Embodiments, wherein the crystal comprises a single crystal having a largest dimension of about 1 mm to about 10 mm.

Embodiment 43: The organic antimony halide of any of the preceding Embodiments, wherein the crystal has a PLQE of at least 97%.

Embodiment 44: The organic antimony halide of any of the preceding Embodiments, wherein the crystal has a PLQE of at least 98%.

Embodiment 45: The organic antimony halide of any of the preceding Embodiments, wherein (i) the crystal has a first PLQE measured within one week of the crystal's creation, (ii) a second PLQE measured after the crystal is stored at ambient conditions for at least one year or at least 2 years following the crystal's creation, and (iii) the second PLQE is no more than 3 percentage points, 2 percentage points, or 1 percentage point less than the first PLQE.

Embodiment 46: A scintillator screen comprising the organic antimony halide of any one of the previous Embodiments.

Embodiment 47: A method or device of any one of Embodiments 1 to 34, wherein the metal halide hybrid comprises the organic antimony halide of any one of Embodiments 35 to 45.

Embodiment 48: An organic manganese (II) halide hybrid comprising a crystal according to Formula (III)—

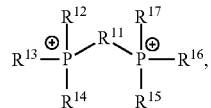

wherein X is a halide, and R' is an organic phosphonium cation.

Embodiment 49: The organic manganese (II) halide hybrid of any of the preceding Embodiments, wherein the organic phosphonium cation has a structure according to Formula (IV):

$$R^{13}-\overset{R^{12}}{\underset{R^{14}}{\overset{\oplus}{P}}}-R^{11}-\overset{R^{17}}{\underset{R^{15}}{\overset{\oplus}{P}}}-R^{16},$$

Formula (IV)

wherein each of R$^{11}$-R$^{17}$ is independently selected from a substituted or unsubstituted C$_1$-C$_{20}$ hydrocarbyl.

Embodiment 50: The organic manganese (II) halide hybrid of any of the preceding Embodiments, wherein the organic phosphonium cation is ethylenebis-triphenylphosphonium.

Embodiment 51: The organic manganese (II) halide hybrid of any of the preceding Embodiments, wherein X is Br.

Embodiment 52: The organic manganese (II) halide hybrid of any of the preceding Embodiments, wherein the crystal has a 0D structure.

Embodiment 53: The organic manganese (II) halide hybrid of any of the preceding Embodiments, wherein the crystal exhibits a green emission peaked at 517 nm.

Embodiment 54: The organic manganese (II) halide hybrid of any of the preceding Embodiments, wherein the crystal has a PLQE of at least 95%.

Embodiment 55: The organic manganese (II) halide hybrid of any of the preceding Embodiments, wherein the crystal exhibits a (i) light yield of at least 50,000 photons/MeV, at least 60,000 photons/MeV, at least 70,000 photons/MeV, or about 70,000 to about 90,000 photons/MeV, (ii) a detection limit of about 50 nGy/s to about 100 nGy/s, or (iii) a combination thereof.

Embodiment 56: A scintillator screen comprising the organic manganese (II) halide hybrid of any one of Embodiments 48 to 55.

Embodiment 57: A method or device of any one of Embodiments 1 to 34, wherein the metal halide hybrid comprises the organic manganese (II) halide hybrid of any one of Embodiments 48 to 55.

The phrases "C$_1$-C$_{20}$ hydrocarbyl," and the like, as used herein, generally refer to aliphatic, aryl, or arylalkyl groups containing 1 to 20 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having 1 to about 20 carbon atoms. Examples of alkyl groups include, but are not limited to, methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl and dodecyl.

Cycloalkyl moieties may be monocyclic or multicyclic, and examples include cyclopropyl, cyclobutyl, cyclopentyl, cyclohexyl, and adamantyl. Additional examples of alkyl moieties have linear, branched and/or cyclic portions (e.g., 1-ethyl-4-methyl-cyclohexyl). Representative alkenyl moieties include vinyl, allyl, 1-butenyl, 2-butenyl, isobutylenyl, 1-pentenyl, 2-pentenyl, 3-methyl-1-butenyl, 2-methyl-2-butenyl, 2,3-dimethyl-2-butenyl, 1-hexenyl, 2-hexenyl, 3-hexenyl, 1-heptenyl, 2-heptenyl, 3-heptenyl, 1-octenyl, 2-octenyl, 3-octenyl, 1-nonenyl, 2-nonenyl, 3-nonenyl, 1-decenyl, 2-decenyl and 3-decenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl, 2-hexynyl, 5-hexynyl, 1-heptynyl, 2-heptynyl, 6-heptynyl, 1-octynyl, 2-octynyl, 7-octynyl, 1-nonynyl, 2-nonynyl, 8-nonynyl, 1-decynyl, 2-decynyl and 9-decynyl. Examples of aryl or arylalkyl moieties include, but are not limited to, anthracenyl, azulenyl, biphenyl, fluorenyl, indan, indenyl, naphthyl, phenanthrenyl, phenyl, 1,2,3,4-tetrahydro-naphthalene, tolyl, xylyl, mesityl, benzyl, and the like, including any heteroatom substituted derivative thereof.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), aryl, aryloxy, azo, carbamoyl (—NHC(O)O-alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —$CCl_3$, —$CF_3$, —$C(CF_3)_3$), heteroalkyl, isocyanate, isothiocyanate, nitrile, nitro, phosphodiester, sulfide, sulfonamido (e.g., $SO_2NH_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

All referenced publications are incorporated herein by reference. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When methods or apparatuses are claimed or described in terms of "comprising" various steps or components, the methods or apparatuses can also "consist essentially of" or "consist of" the various steps or components, unless stated otherwise.

The terms "a," "an," and "the" are intended to include plural alternatives, e.g., at least one. For instance, the disclosure of "a crystal," "a halide," "a scintillation material", and the like, is meant to encompass one, or mixtures or combinations of more than one crystal, halide, scintillation material, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, that a crystal comprises a single crystal having a largest dimension of about 1 mm to about 10 mm. This range should be interpreted as encompassing about 1 mm to about 10 mm, and further encompasses "about" each of 2 mm, 3 mm, 4 mm, 5 mm, 6 mm, 7 mm, 8 mm, and 9 mm, including any ranges and sub-ranges between any of these values.

As used herein, the term "about" means plus or minus 10% of the numerical value of the number with which it is being used.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Highly Efficient Eco-Friendly X-Ray Scintillators Based on an Organic Manganese Halide In this example, a new 0D organic manganese (II) halide hybrid $(C_{38}H_{34}P_2)MnBr_4$ was synthesized, which exhibited highly efficient green emission upon photo and X-ray excitations. Single crystals with sizes of >1 cm were prepared via a facile solution growth method at room temperature, which showed remarkable scintillation properties with excellent response linearity to dose rate, high light yield, and low detection limits. X-ray imaging was successfully demonstrated with high resolution. The low-cost, facile preparation, environmentally friendly, and state-of-the-art scintillation performance made this organic manganese (II) hybrid $(C_{38}H_{34}P_2)MnBr_4$ a highly promising scintillator for commercial applications.

The following materials were used in this example. Manganese (II) bromide, and Ethylenebis(triphenylphosphonium bromide) were purchased from Sigma-Aldrich. Dimethylformamide (DMF, 99.8%), Dichloromethane (DCM, 99.9%), Diethyl ether ($Et_2O$, 99.8%) was purchased from VWR. Standard scintillator Ce:LuAG was purchased from Jiaxing AOSITE Photonics Technology Co., Ltd. All reagents and solvents were used without further purification unless otherwise stated.

Growth of 0D $(C_{38}H_{34}P_2)MnBr_4$ Single crystals. $MnBr_2$ (1.0 mmol) and Ethylenebis(triphenylphosphonium bromide) (1.0 mmol) were dissolved in 2 mL DCM solution and then filtered into a small vial to form a clear precursor solution. The small vial was then put in a larger vial with 10 mL of $Et_2O$ inside. The as-prepared solution was sealed and left to stand for about 3 days to afford pale green block crystals. The crystals were obtained at a yield of about 89%.

Scintillator screen. Firstly, $(C_{38}H_{34}P_2)MnBr_4$ single crystals were hand-ground to fine powders by using mortar and pestle. Then the scintillator screen was prepared by filling the fine powder into the PXRD holder. The flexible screen was prepared by blending the powder with a two-part polydimethylsiloxane (PDMS) EI-1184 at a concentration of 800 mg/ml. The mixture gel was placed in a polytetrafluoroethylene (PTFE) mold and cured at 100° C. for 30 minutes, under ambient atmosphere.

Single crystal X-ray diffraction (SCXRD). Single crystal X-ray data for the $(C_{38}H_{34}P_2)MnBr_4$ hybrid were collected using a Rigaku XtaLAB Synergy-S diffractometer equipped with a HyPix-6000HE Hybrid Photon Counting (HPC) detector and dual Mo and Cu microfocus sealed X-ray source.

Powder X-ray diffraction (PXRD). The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern, S, was scanned over the angular range of 5-40 degree (2θ) with a step size of 0.02, at room temperature.

Absorption spectrum measurements. Absorption spectra of $(C_{38}H_{34}P_2)MnBr_4$ hybrid were measured at room temperature on Cary 5000 UV-Vis-NIR spectrophotometer.

Photoluminescence steady state studies. Steady-state photoluminescence spectrum of $(C_{38}H_{34}P_2)MnBr_4$ was obtained at room temperature on a FS5 spectrofluorometer (Edinburgh Instruments).

Photoluminescence quantum efficiency (PLQE). The PLQEs were acquired using a Hamamatsu Quantaurus-QY Spectrometer (Model C11347-11) equipped with a xenon lamp, integrated sphere sample chamber and CCD detector. The PLQEs were calculated by the equation: $\eta QE=IS/(ER-ES)$, in which IS represents the luminescence emission spectrum of the sample, ER is the spectrum of the excitation light from the empty integrated sphere (without the sample), and ES is the excitation spectrum for exciting the sample.

Time-resolved photoluminescence. Time-Resolved Emission data were collected at room temperature using the Edinburgh FLS920 fluorescence spectrometer. The dynamics of emission decay were monitored by using the time-correlated single-photon counting capability with data collection for 10,000 counts. The average lifetime was obtained by single-exponential fitting.

Thermogravimetric analysis (TGA). TGA was carried out using a TA instruments Q50 TGA system. The samples were heated from room temperature (around 25° C.) to 700° C. at a rate of 5° C. $min^{-1}$, under a nitrogen flux of 100 ml $min^{-1}$.

Radioluminescence (RL) and X-ray imaging. The spectra of radioluminescence was acquired by using an Edinburgh FS5 spectrofluorometer (Edinburgh Instruments) equipped with a X-ray source (Amptek Mini-X tube with a Au target and 4 W maximum power output). The radiation dose rate of the X-ray source was calibrated by using an ion chamber dosimeter. The X-ray images are acquired by using digital camera (Nikon D90).

Scanning electron microscopy (SEM). The particle size of $(C_{38}H_{34}P_2)MnBr_4$ fine powders were investigated by FEI Nova NanoSEM 400 scanning electron microscope.

In this example, high performance eco-friendly X-ray scintillators based on a 0D phosphonium manganese (II) bromide hybrid $(C_{38}H_{34}P_2)MnBr_4$ were prepared.

The organic manganese (II) halide hybrid of this example was easily prepared by using low-cost commercially available raw materials via a facile room temperature solvent diffusion method with excellent repeatability and large scalability. High quality $(C_{38}H_{34}P_2)MnBr_4$ single crystals of this example with sizes of >1 cm showed great thermal stability and bright green emission peaked at 517 nm with a PLQE of ~95%. Scintillators based on $(C_{38}H_{34}P_2)MnBr_4$ displayed great performance with exceptional linearity, high light yield, and low detection limits, which enabled high resolution X-ray images.

In this example, 0D $(C_{38}H_{34}P_2)MnBr_4$ single crystals were obtained by diffusing diethyl ether into a dichloromethane (DCM) precursor solution containing ethylenebis(triphenyl-phosphonium bromide) $(C_{38}H_{34}P_2Br_2)$ and $MnBr_2$ in a ratio of 1:1.

The crystal structure of $(C_{38}H_{34}P_2)MnBr_4$ single crystals was determined by single crystal X-ray diffraction (SCXRD). $(C_{38}H_{34}P_2)MnBr_4$ crystallized at a monoclinic space group of $C_{2/c}$, and possessed a 0D structure at the molecular level with $MnBr_4$ tetrahedrons isolated and surrounded by $C_{38}H_{34}P_2^{2+}$ cations. The manganese center adopted a typical tetra-coordinated geometry bonded to bromide ions, with an average Mn—Br bond length of 2.51 Å and bond angle of 108.48 (see details in Table A and Table B), similar to those of previously reported $MnBr_4$ complexes (Xu, L. J., Sun, C. Z., Xiao, H., Wu, Y., Chen, Z. N. Green-Light-Emitting Diodes based on Tetrabromide Manganese (II) Complex through Solution Process. *Advanced Materials* 2017, 29 (10)).

TABLE A

| Single X-ray diffraction data of $(C_{38}H_{34}P_2)MnBr_4$ | |
|---|---|
| Compound | $(C_{38}H_{34}P_2)MnBr_4$ |
| Empirical formula | $C_{38}H_{34}Br_4P_2Mn$ |
| Molecular weight | 927.13 |
| Temperature/K | 293(2) |
| Crystal system | monoclinic |
| Space group | $C_{2/c}$ |
| a/Å | 10.108(3) |
| b/Å | 18.594(5) |
| c/Å | 20.176(6) |
| α/° | 90 |
| β/° | 99.860(4) |
| γ/° | 90 |
| Volume/Å³ | 3736.0(19) |
| Z | 4 |
| $\rho_{calc}$ g/cm³ | 1.648 |
| μ/mm⁻¹ | 4.743 |

TABLE A-continued

Single X-ray diffraction data of $(C_{38}H_{34}P_2)MnBr_4$

| | |
|---|---|
| $R_1$, $wR_2$ | 0.0305[a], 0.1110[b] |
| Goodness-of-fit on $F^2$ | 0.835 |

[a] $R1 = \Sigma ||F_o| - |F_c|| / \Sigma |F_o|$.
[b] $wR2 = [\Sigma w(F_o^2 - F_c^2)^2 / \Sigma w(F_o^2)^2]^{1/2}$

TABLE B

Selected bond length and bond angle of $(C_{38}H_{34}P_2)MnBr_4$

| Bond | Distance (Å) |
|---|---|
| Mn1-Br1 | 2.505 |
| Mn1-Br2 | 2.520 |

| Bonds | Angle (°) |
|---|---|
| Br1-Mn1-Br1A | 101.6 |
| Br1-Mn1-Br2 | 113.5 |
| Br1-Mn1-Br2A | 106.8 |
| Br2-Mn1-Br2A | 114.0 |

The powder X-ray diffraction pattern of $(C_{38}H_{34}P_2)MnBr_4$ powders was identical to the simulated result from SCXRD data, which suggested the high phase purity of the as-prepared single crystals. No weight loss was observed before 310° C. in thermogravimetric analysis (TGA), which suggested a high thermal stability.

Figure 2:
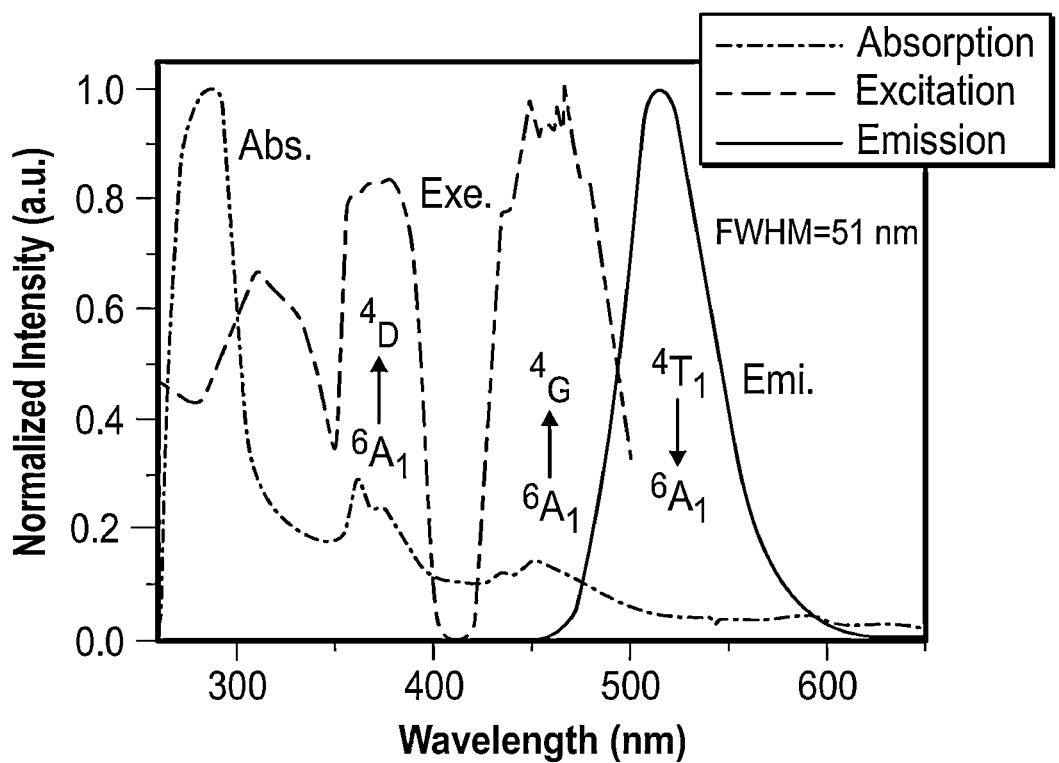
FIG. 2 depicts the absorption, excitation, and emission spectra of an embodiment of a metal halide hybrid.

The $(C_{38}H_{34}P_2)MnBr_4$ single crystals were pale green under ambient light and became highly emissive upon irradiating with UV light as shown at FIG. 2.

Figure 3:
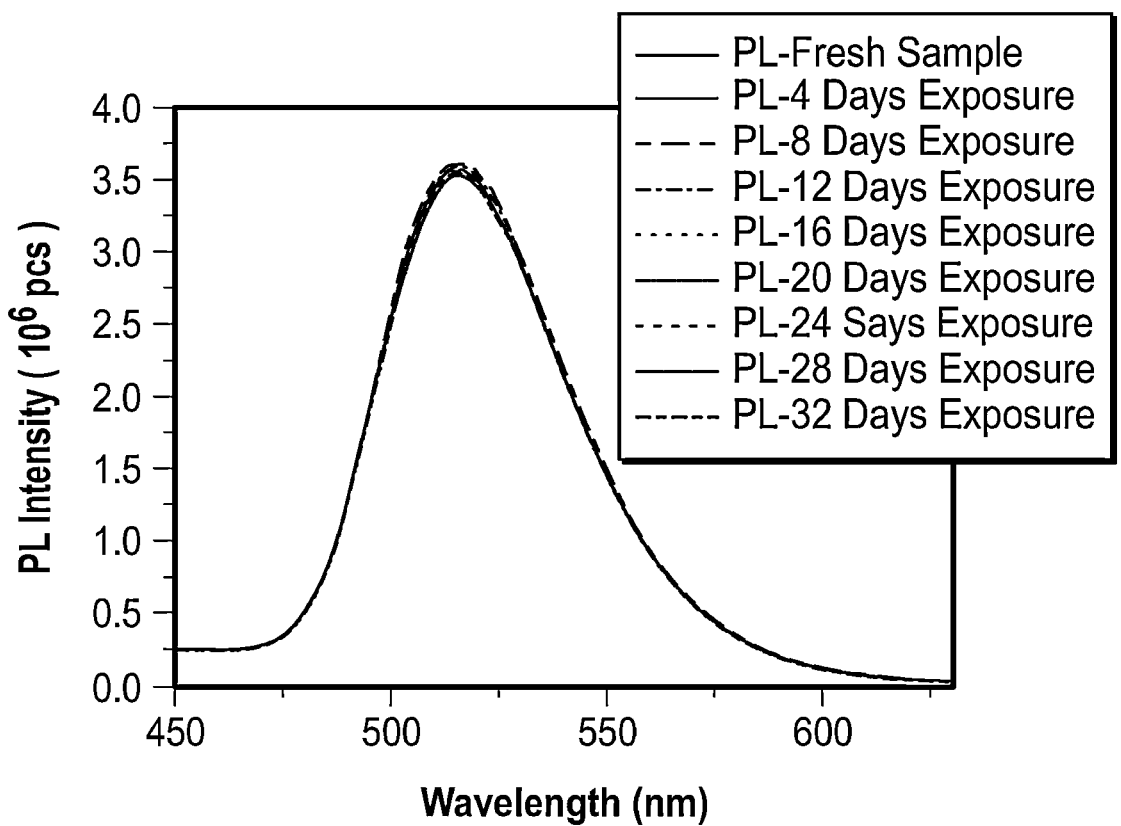
FIG. 3 depicts the photoluminescence intensity of an embodiment of a metal halide hybrid at various times from 0 to 32 days.

The photophysical properties were further investigated using UV-vis absorption and steady-state photoluminescence (PL) spectroscopies. As shown in FIG. 2, $(C_{38}H_{34}P_2)MnBr_4$ exhibited an intense absorption band around 285 nm along with two absorption peaks at 360 and 450 nm. The excitation spectra had the same features as absorption spectra in low-energy band, which corresponded to two groups of transitions: $^6A_1 \rightarrow {}^4G$ and $^6A_1 \rightarrow {}^4D$. Upon irradiation in the range of 300-400 nm, bright green emission peaked at 517 nm was observed with a full width at half maximum (FWHM) of 51 nm, a high PLQE of ~95% and a long lifetime of 318 µs. The strong green emission was well known to be from d-d $^4T_1 \rightarrow {}^6A_1$ transition of $Mn^{2+}$ ion with a tetrahedral coordination geometry. Moreover, $(C_{38}H_{34}P_2)MnBr_4$ demonstrated great moisture stability with PL intensity unchanged after exposure in ambient atmosphere for one month, as depicted at FIG. 3. The high emission efficiency together with good quality of easily prepared single crystals suggested the suitability of $(C_{38}H_{34}P_2)MnBr_4$ for luminescent devices.

Figure 4A:
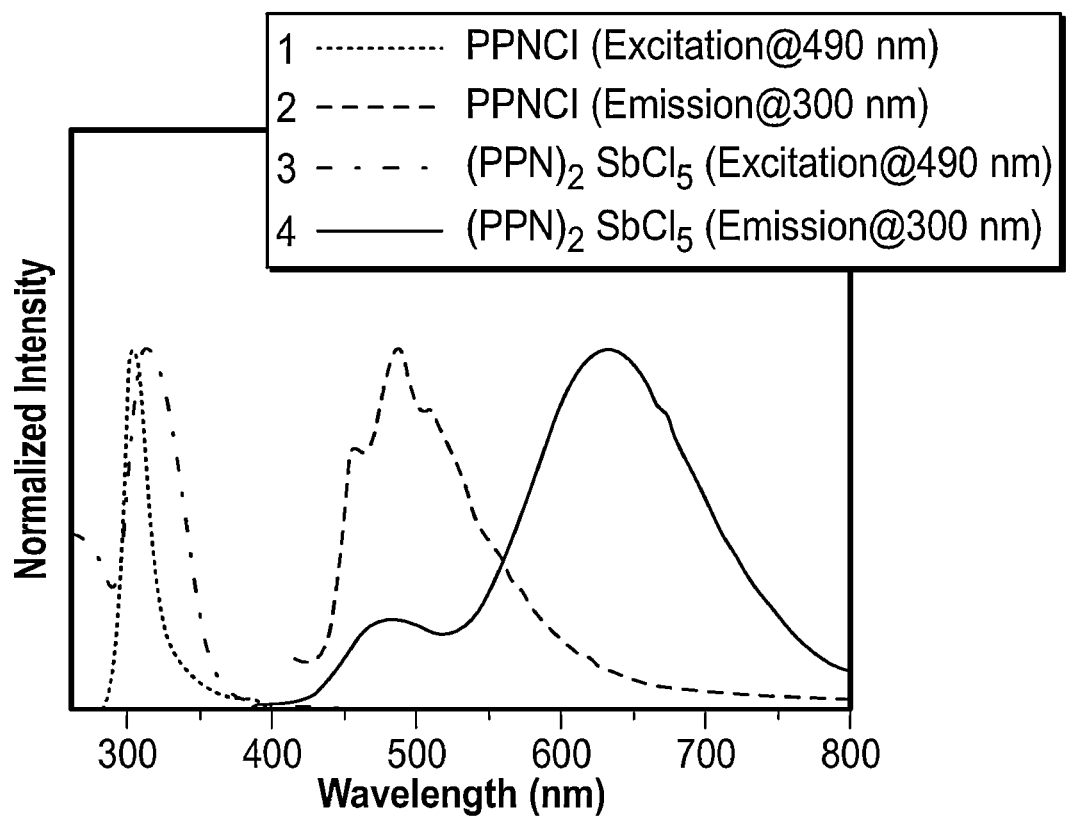
FIG. 4A depicts excitation and emission spectra of an embodiment of a metal halide hybrid.
Figure 4B:
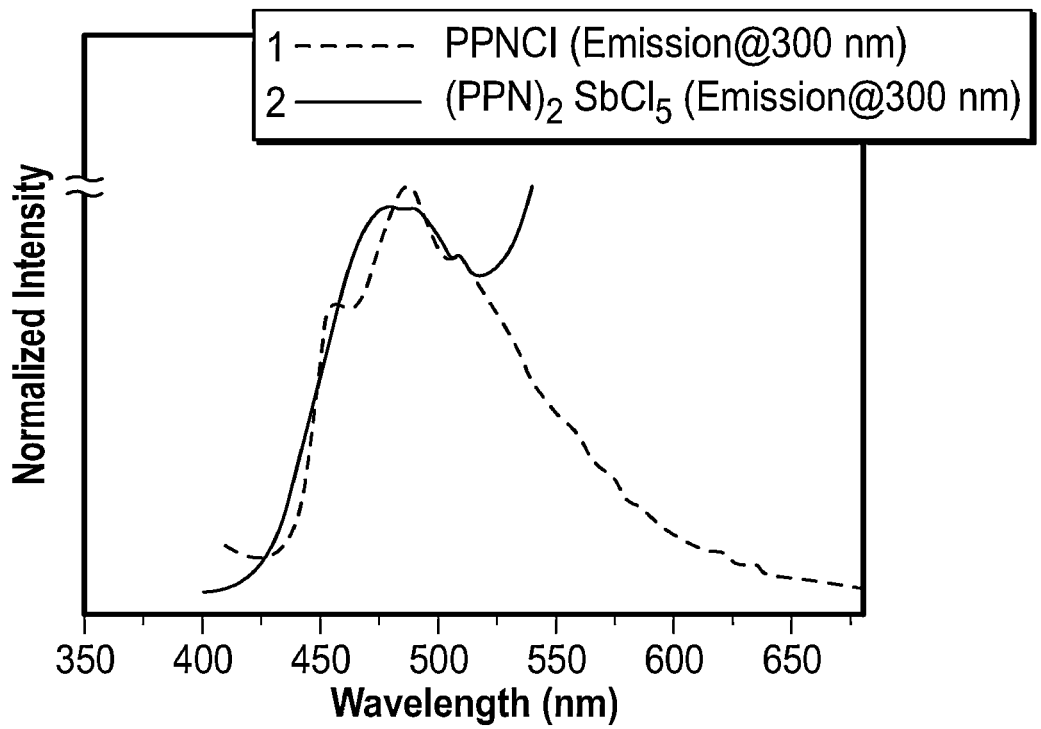
FIG. 4B depicts emission spectra of an embodiment of a metal halide hybrid at 300 nm.

To explore the scintillation performance of $(C_{38}H_{34}P_2)MnBr_4$, a commercially available scintillation material, cerium-doped lutetium aluminum garnet (Ce:LuAG), was used as a standard reference as it exhibits a similar PL emission peaked at around 520 nm. The X-ray radioluminescence (RL) spectra of $(C_{38}H_{34}P_2)MnBr_4$ and Ce:LuAG were obtained by using Edinburgh FS5 fluorescence spectrophotometer equipped with a X-ray generator (Amptek Mini-X tube, Au target, 4 W). As shown at FIG. 4A and FIG. 4B, both RL emissions were identical to their PL emissions. Interestingly, the RL intensity of $(C_{38}H_{34}P_2)MnBr_4$ was more than 3 times higher than that of Ce:LuAG under the same X-ray dose rate irradiation.

Moreover, the X-ray image of $(C_{38}H_{34}P_2)MnBr_4$ single crystals was much brighter than that of Ce:LuAG (specifically, $(C_{38}H_{34}P_2)MnBr_4$ single crystals exhibited an RL intensity of about 16 $10^{10}$ cps at an X-ray dose rate of 20.8 microGy/s, while, under the same conditions, Ce:LuAG exhibited an RL intensity of about 4.2 $10^{10}$ cps), which suggested that $(C_{38}H_{34}P_2)MnBr_4$ was more sensitive to X-ray irradiation than Ce:LuAG. To evaluate the scintillator response to X-ray dose rate, the RL intensities were measured under various X-ray dose rates for $(C_{38}H_{34}P_2)MnBr_4$ and Ce:LuAG. Both scintillators exhibited excellent linearities to the X-ray dose rates in a large range from 36.7 nGy/s to 89.4 µGy/s. Moreover, $(C_{38}H_{34}P_2)MnBr_4$ exhibited a higher response to X-ray dose than Ce:LuAG with a larger slope. The detection limits of X-ray dose rate was measured to be 72.8 nGy/s for $(C_{38}H_{34}P_2)MnBr_4$, which is about 75 times lower than the dose rate required for X-ray diagnostics (5.5 µGy/s). Light yield was another important parameter to evaluate the performance of scintillators, which was dependent on the amplitude of X-ray response and the RL spectra. Since the X-ray dose response of $(C_{38}H_{34}P_2)MnBr_4$ was 3.2 times higher than that of Ce:LuAG (with a light yield of 25,000 Ph/MeV) and they had a similar RL spectra, the light yield of $(C_{38}H_{34}P_2)MnBr_4$ could be derived to be around 79,800 Photon/MeV.

Figure 5A:
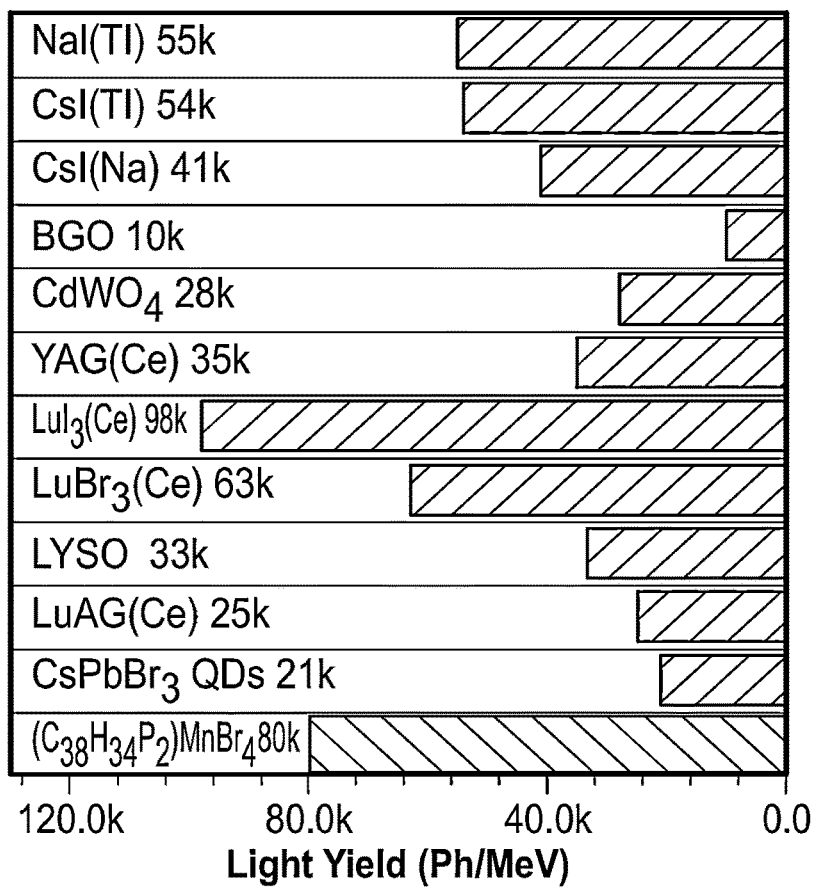
FIG. 5A depicts a comparison of scintillator light yields of an embodiment of a metal halide hybrid and commercially available scintillators.
Figure 5B:
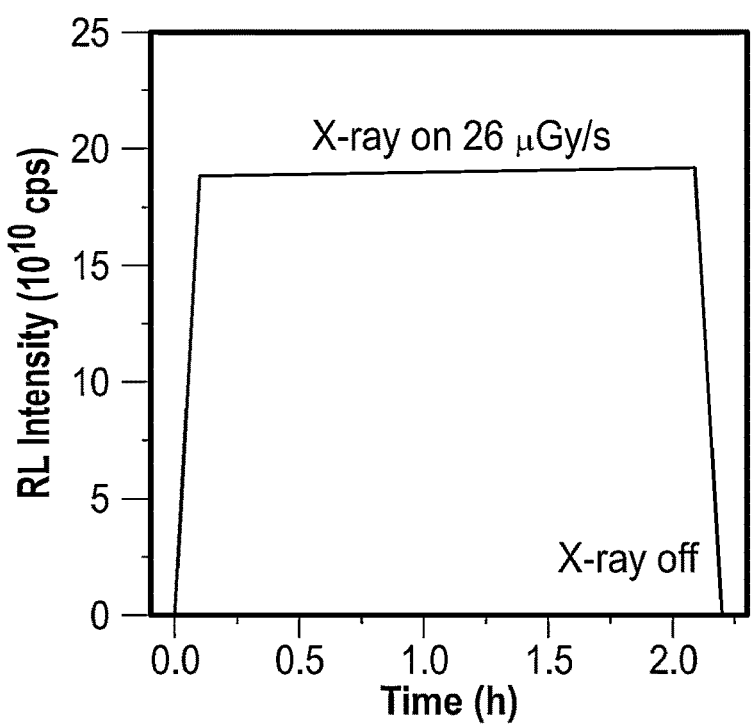
FIG. 5B depicts a plot of the change in intensity observed for an embodiment of a metal halide hybrid under continuous X-ray excitation at a dose rate of 26 microGy/s.

As shown at FIG. 5A, the light yield of $(C_{38}H_{34}P_2)MnBr_4$ was much better than those of widely investigated $CsPbBr_3$ nanocrystals and many commercially available scintillators, such as CsI(Tl), YAG(Ce) and $LuBr_3$(Ce). The stability of $(C_{38}H_{34}P_2)MnBr_4$ single crystals against X-ray irradiation was evaluated by monitoring the changes of RL intensity under continuous X-ray irradiation with a dose rate of 26 µGy/s. FIG. 5B shows that no radio-degradation was observed after 2 h exposure to X-ray irradiation, suggesting high stability for scintillator application.

To further validate the potential of $(C_{38}H_{34}P_2)MnBr_4$ as scintillation material for practical X-ray imaging, a home-built X-ray imaging system was constructed. The scintillator screen was prepared by refilling a glass holder with $(C_{38}H_{34}P_2)MnBr_4$ fine powders with the particle size less than 3 µm (SEM images of the powders were collected). A speaker chip with a size of 9 mm×6 mm was used as target placed between the X-ray source and the scintillator screen for X-ray image. The configuration inside of the chip could not be seen directly with the naked eye, but was revealed clearly with X-ray imaging using a $(C_{38}H_{34}P_2)MnBr_4$ based scintillator. The large difference in X-ray absorption for different materials in the chip resulted in spatial intensity contrast displayed in the scintillator screen. The excellent performance of X-ray imaging could be attributed to the high PLQE, light yield, and/or low detection limit of $(C_{38}H_{34}P_2)MnBr_4$.

In this example, flexible scintillators with large size (4.5×5.8 cm) were demonstrated by blending $(C_{38}H_{34}P_2)MnBr_4$ fine powders with PDMS. The resulting films showed excellent flexibility, which could be easily bended and stretched. Moreover, the film showed high uniformity and strong emission under UV irradiation. To demonstrate the capability of the X-ray imaging, a wrench and speaker chip were scanned as the targets. Distinct color contrast and detail inside of the chip could be displayed in the flexible film with good resolution.

Example 2—Highly Stable Lead-Free Organic Antimony Halide Crystals for X-Ray Scintillation In this example, the following materials were used: Antimony (III) chloride ($SbCl_3$, 99.95%), bis(triphenylphosphoranylidene) ammonium chloride (PPNCl, 97%), and Dichloromethane (DCM, ≥99.8%) were purchased from Sigma-Aldrich. Dimethylformamide (DMF, 99.8%) and diethyl ether (Et$_2$O, anhydrous) were bought for VWR.

In this example, (PPN)$_2$SbCl$_5$ single crystals were prepared by injecting diethyl ether into a dichloromethane precursor solution of SbCl$_3$ and PPNCl at room temperature in an N$_2$-filled glovebox and stood for overnight. The detailed synthesis and characterization are described below.

The crystal structure of the obtained (PPN)$_2$SbCl$_5$ single crystals was determined by single crystal X-ray diffraction (SCXRD) at 150 K. The results indicated that the isolated SbCl$_5^-$ anions ionically bonded to surrounding bulky PPN$^+$ cations, forming a typical 0D organic-inorganic metal halide hybrid structure with monoclinic P2$_1$/c symmetry (Table C).

TABLE C

Single crystal XRD data and the corresponding collection parameters of (PPN)$_2$SbCl$_5$. The data was recorded at a temperature of 150 K.

| Compound | Antimony pentachloride bis(triphenylphosphoranylidene)ammonium |
|---|---|
| Empirical formula | C$_{72}$H$_{60}$N$_2$P$_4$SbCl$_5$ |
| Formula weight | 1376.10 |
| Temperature/K | 149.99(10) |
| Crystal system | monoclinic |
| Space group | P2$_1$/c |
| a/Å | 11.0421(2) |
| b/Å | 24.1416(4) |
| c/Å | 24.0743(4) |
| α/° | 90 |
| β/° | 90.6060(10) |
| γ/° | 90 |
| Volume/Å$^3$ | 6417.22(19) |
| Z | 4 |
| ρ$_{calc}$g/cm$^3$ | 1.424 |
| μ/mm$^{-1}$ | 0.783 |
| Crystal size/mm$^3$ | 0.303 × 0.264 × 0.128 |
| Radiation | Mo Kα (λ = 0.71073) |
| 2Θ range for data collection/° | 3.688 to 65.202 |
| Index ranges | −15 ≤ h ≤ 14, −34 ≤ k ≤ 32, −32 ≤ l ≤ 36 |
| Reflections collected | 92625 |
| Independent reflections | 19486 [R$_{int}$ = 0.0524, R$_{sigma}$ = 0.0424] |
| Data/restraints/parameters | 19486/0/757 |
| Goodness-of-fit on F$^2$ | 1.086 |
| Final R indexes [I >= 2σ (I)] | R$_1$ = 0.0346, wR$_2$ = 0.0840 |
| Final R indexes [all data] | R$_1$ = 0.0470, wR$_2$ = 0.0881 |
| Largest diff. peak/hole/e Å$^{-3}$ | 0.60/−0.68 |

TABLE D

Selected bond lengths and bond angles of (PPN)$_2$SbCl$_5$.

| Atom | Atom | Length/Å | Atom | Atom | Atom | Angle/° |
|---|---|---|---|---|---|---|
| Sb1 | Cl1 | 2.3810(4) | Cl1 | Sb1 | Cl2 | 87.908(19) |
| Sb1 | Cl2 | 2.6397(5) | Cl1 | Sb1 | Cl3 | 89.713(16) |
| Sb1 | Cl3 | 2.5964(5) | Cl1 | Sb1 | Cl4 | 87.314(16) |
| Sb1 | Cl4 | 2.5876(4) | Cl1 | Sb1 | Cl5 | 88.669(15) |
| Sb1 | Cl5 | 2.6363(5) | Cl3 | Sb1 | Cl2 | 91.274(19) |
| | | | Cl3 | Sb1 | Cl5 | 177.896(15) |
| | | | Cl4 | Sb1 | Cl2 | 175.209(19) |
| | | | Cl4 | Sb1 | Cl3 | 89.059(15) |

A single SbCl$_5^-$ anion showed that each antimony atom was bonded to five chlorine atoms to form the pyramid structure. The bond distance between Sb atom and apical Cl atom in SbCl$_5^{2-}$ anion was ~2.38 Å, while the lengths of the other Sb—Cl bonds were from 2.58 to 2.64 Å, which were comparable to reported SbCl$_5^{2-}$ structures (Table D). The powder XRD pattern of ground (PPN)$_2$SbCl$_5$ crystals was consistent with the simulated result based on its single crystal structure, confirming the reliability of SCXRD measurement. This result also suggested the uniformity of 0D crystals and the structure stability of single crystals at low temperature (150 K).

(PPN)$_2$SbCl$_5$ single crystals with a size of several millimeters were light-yellow under ambient light, and the corresponding band gap was calculated to be ~2.7 eV from UV-Vis spectrum. Under UV light irradiation (365 nm), the crystals displayed bright salmon pink luminescence with a high photoluminescence quantum efficiency (PLQE) of 98.1%.

Figure 6A:
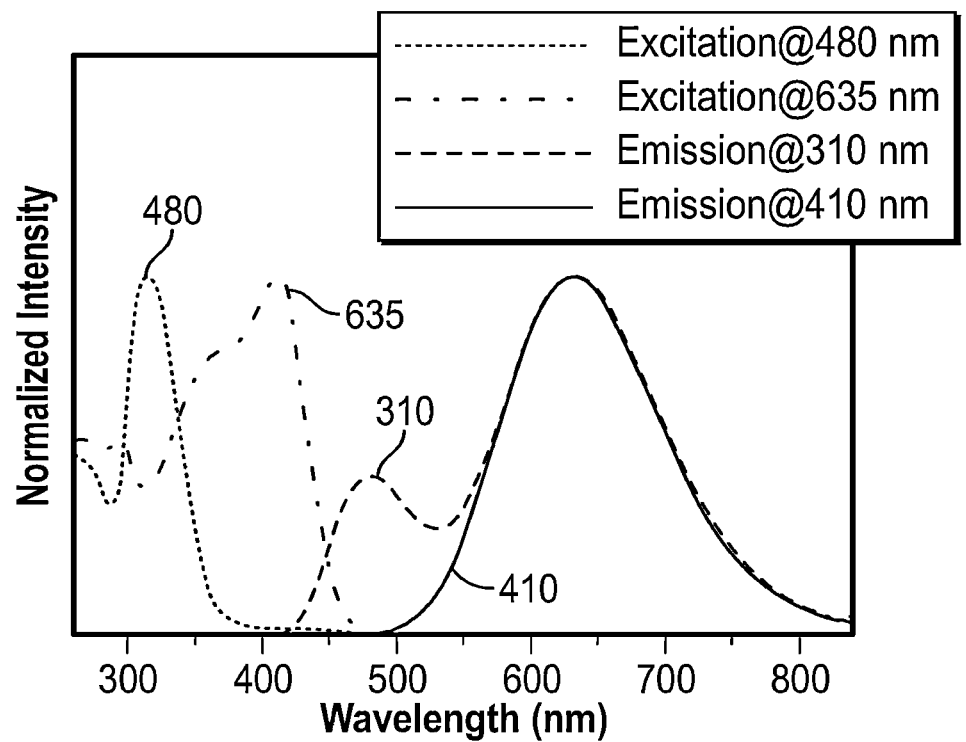
FIG. 6A depicts excitation and emission spectra of an embodiment of a metal halide hybrid.
Figure 6B:
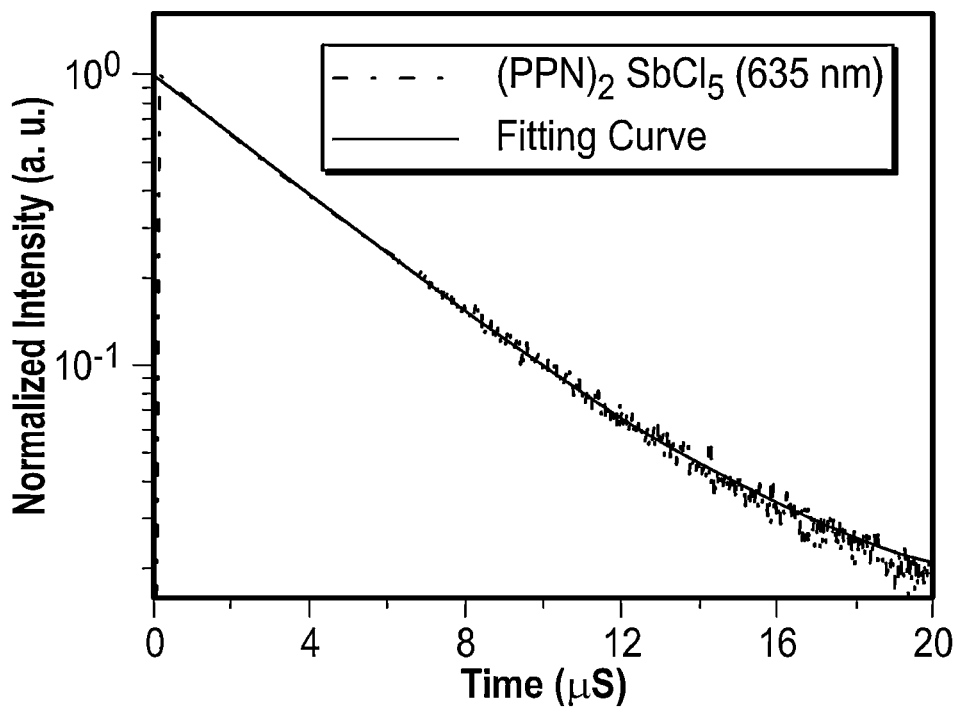
FIG. 6B depicts time resolved photoluminescence spectra of an embodiment of a metal halide hybrid.

The photophysical properties of (PPN)$_2$SbCl$_5$ crystals were further investigated with steady photoluminescence (PL) and time-resolved photoluminescence (TRPL) spectra (FIG. 6A and FIG. 6B). PL spectra revealed that single crystals excited at 410 nm had a low-energy (LE) emission peaked at 635 nm with a large full width at half-maximum (FWHM) of 142 nm and a large Stokes shift of 225 nm (FIG. 6A), and a long decay lifetime ($\tau_{LE}$) of 4.1 μs (FIG. 6B). This emission likely stemmed from the inorganic SbCl$_5^{2-}$ pyramids, as a result of excited state structural reorganization.

Figure 6C:
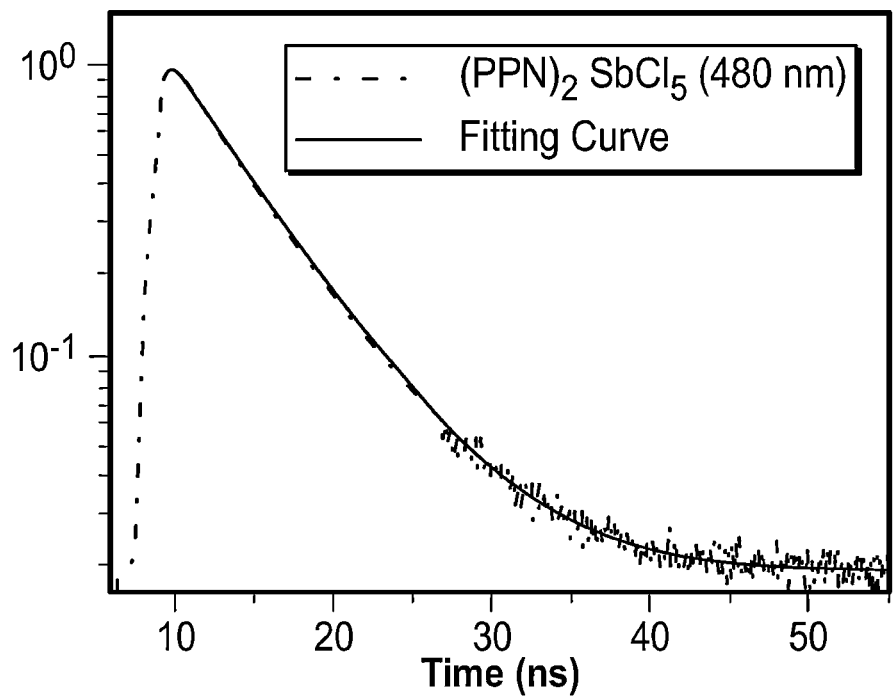
FIG. 6C depicts time resolved photoluminescence spectra of an embodiment of a metal halide hybrid.

A new high-energy (HE) emission peak located at 480 nm was observed when the single crystals were excited at 310 nm (FIG. 6B), which had a decay lifetime ($\tau_{HE}$) of 5.4 ns (FIG. 6C), which suggested that another emitting center that could possibly be the organic component. To reveal the origin of this HE emission, PPNCl single crystals were prepared and measured to explore the luminescence of the organic component. The emission peaks of PPNCl appeared at around 480 nm, which was similar with the HE emission peak of (PPN)$_2$SbCl$_5$, which indicated that the organic component was likely responsible for HE emission.

Figure 7:
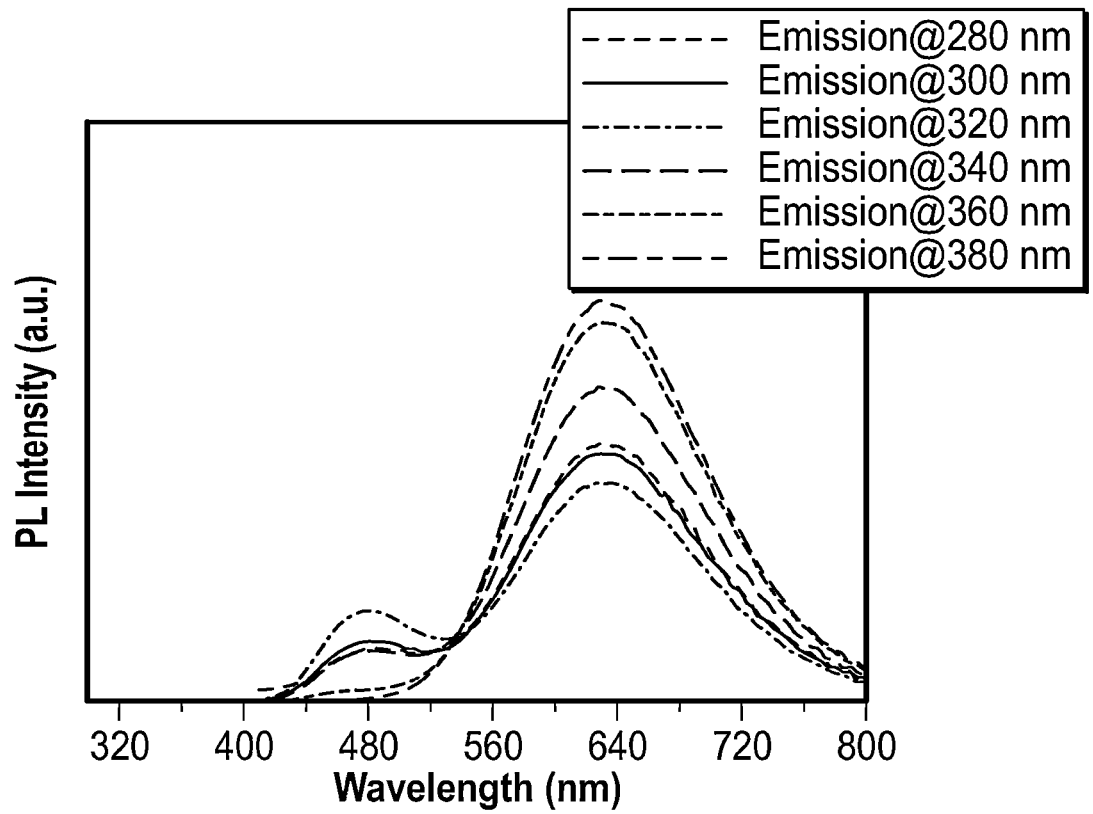
FIG. 7 depicts photoluminescence spectra for an embodiment of a metal halide hybrid.

Meanwhile, the fluorescence emission likely stemmed from singlet STEs of SbCl$_5^{2-}$ pyramids previously observed in this region (see Li, Z. et al., Dual-Band Luminescent Lead-Free Antimony Chloride Halides with Near-Unity Photoluminescence Quantum Efficiency. *Chem. Mater.* 2019, 31, 9363-9371), which might also have attributed to the HE emission of (PPN)$_2$SbCl$_5$. Therefore, the HE emitting center could be assigned to intra-ligand charge transfer (ILCT) of organic cations PPN$^+$ and singlet self-trapped excitons (STEs) of SbCl$_5^{2-}$. Moreover, the PL spectra was also measured for (PPN)$_2$SbCl$_5$ crystals with excitation wavelengths varying from 280 to 380 nm, and it was found that the intensity of high-energy emission peak enhanced firstly and then disappeared (FIG. 7), resulting in excitation-dependent emission profiles.

Figure 8A:
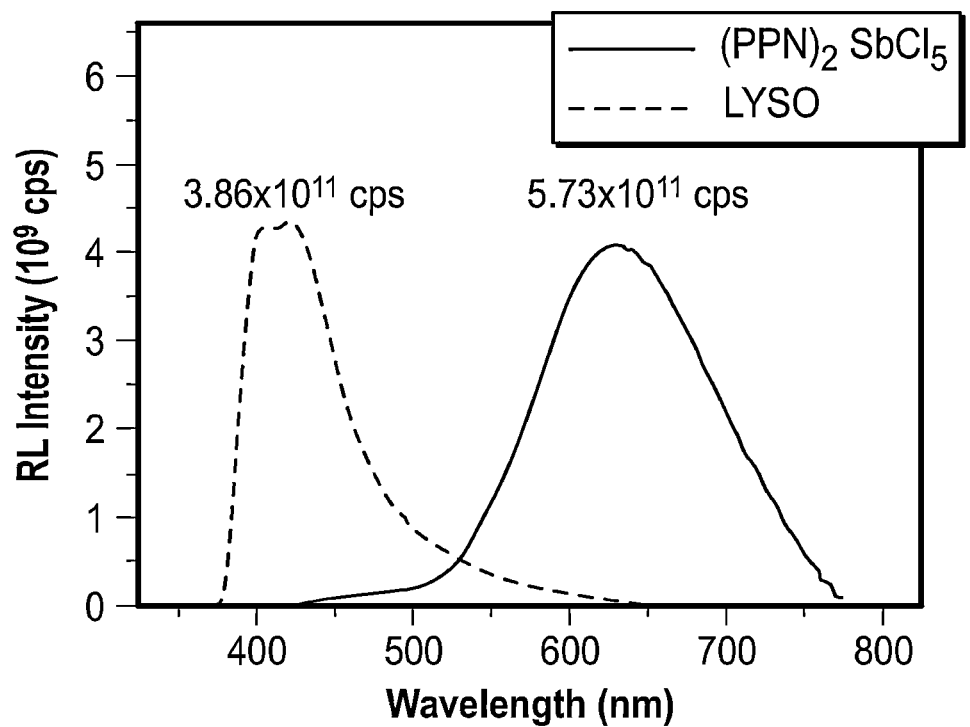
FIG. 8A depicts a random laser spectra of an embodiment of a metal halide hybrid.

Considering the high PLQE, the obtained 0D (PPN)$_2$SbCl$_5$ single crystals could be a candidate as a scintillation material for X-ray radiation detection. Here, an RL spectrum of (PPN)$_2$SbCl$_5$ was measured under 50 KeV X-ray excitation to investigate its scintillation performance (FIG. 8A). A commercially available cerium doped lutetium-based scintillator (LYSO) was used as a reference to quantify the scintillation light yield of (PPN)$_2$SbCl$_5$. Under X-ray irradiation, (PPN)$_2$SbCl$_5$ single crystals exhibited similar spectrum with dual-band emission at ~480 and 635 nm as that of samples excited at 360 nm UV light, while LYSO also exhibited the same phenomenon, which indicated the same radiative recombination channel under X-ray and UV excitations. Importantly, a high channel number of (PPN)$_2$SbCl$_5$ ($5.73\times10^{11}$ cps) at the full energy peak was recorded, which suggested a higher light yield than that of LYSO ($3.86\times10^{11}$ cps).

Figure 8B:
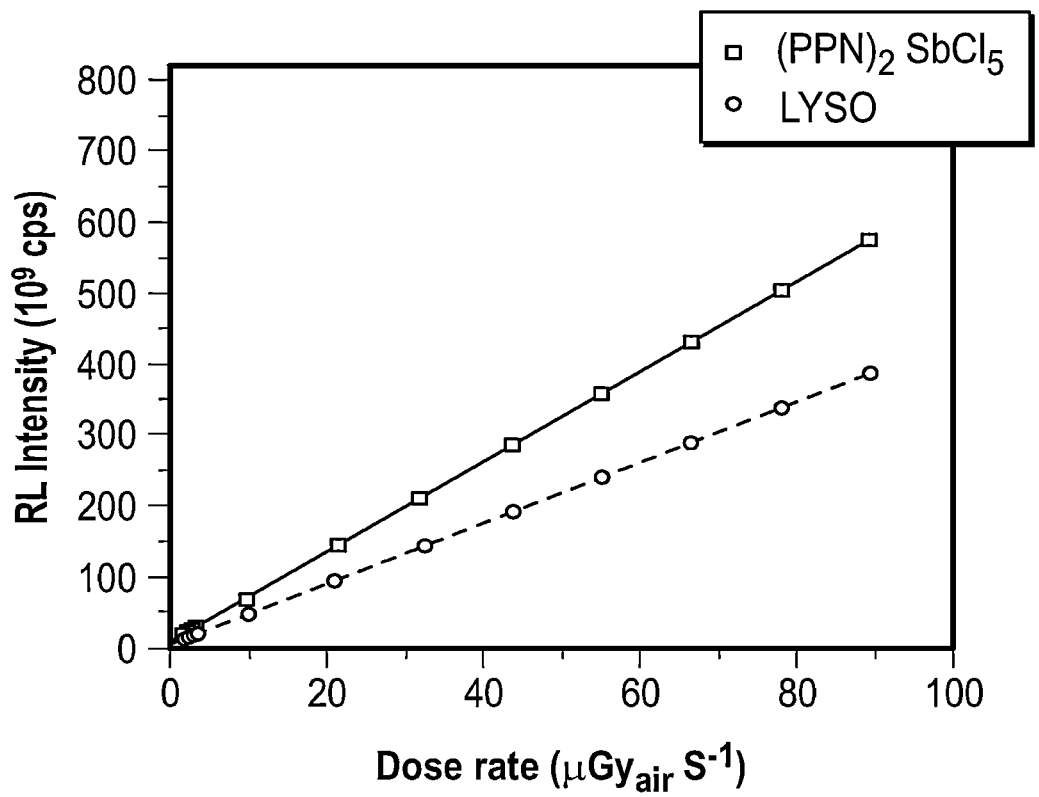
FIG. 8B depicts the relationship between X-ray dose rate and random laser intensity for an embodiment of a metal halide hybrid.

To further evaluate the scintillation performance, RL spectra of $(PPN)_2SbCl_5$ and LYSO crystals under varied X-ray dose rates were measured by changing the powder of X-ray tube. The RL intensities of both $(PPN)_2SbCl_5$ and LYSO were enhanced with the increasing of X-ray dose rate. Moreover, a linear relationship of X-ray dose rate versus RL intensity was recorded for $(PPN)_2SbCl_5$ in a large range from ~10 n $Gy_{air}$ $s^{-1}$ to 90 $\mu Gy_{air}$ $s^{-1}$ (FIG. 8B). The slope value of $(PPN)_2SbCl_5$ was ~1.5 times higher than that of LYSO.

Figure 8C:
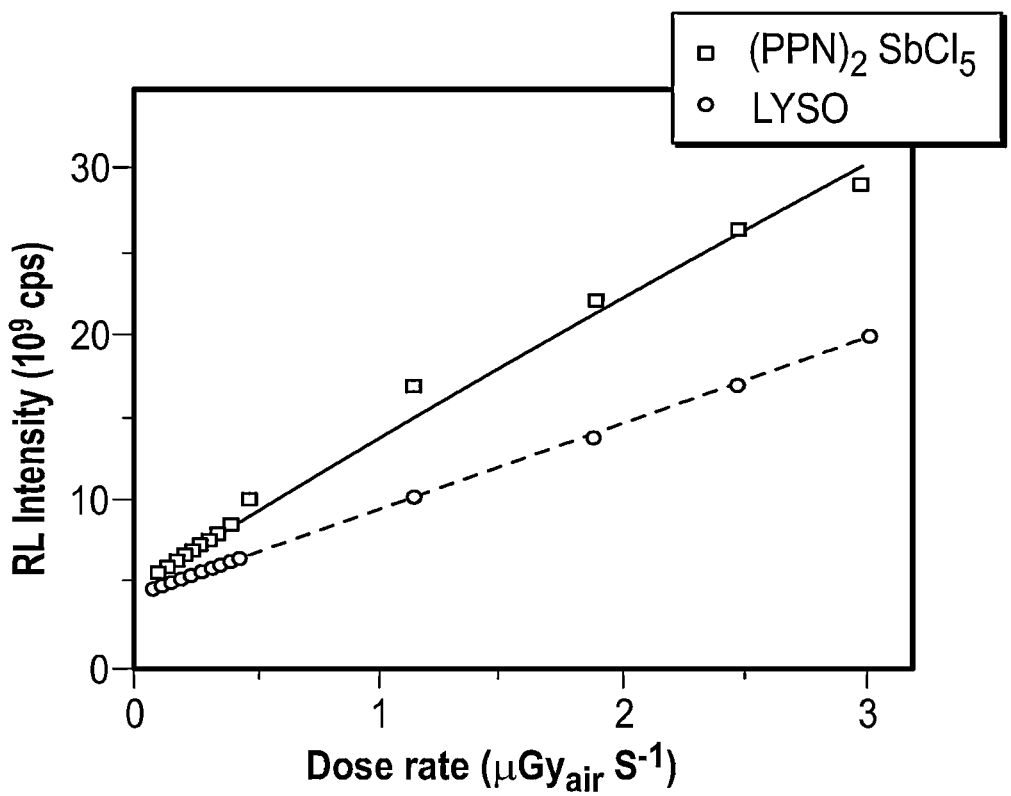
FIG. 8C depicts the relationship between X-ray dose rate and random laser intensity for an embodiment of a metal halide hybrid.
Figure 8D:
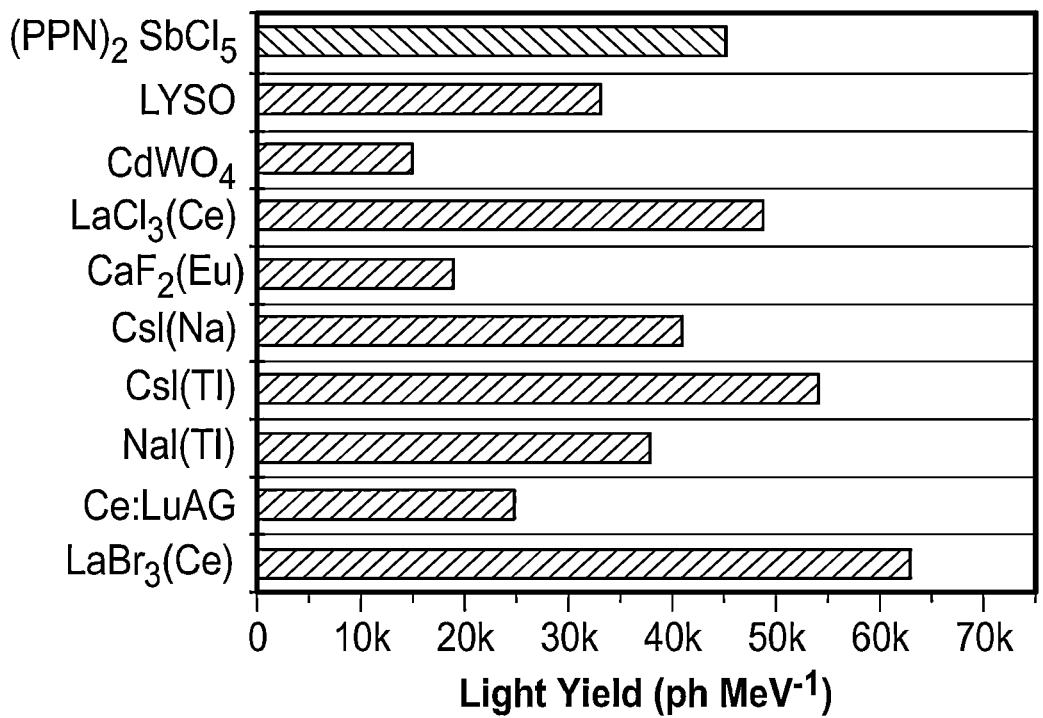
FIG. 8D depicts a comparison of scintillation light yields of an embodiment of a metal halide hybrid and commercially available scintillators.

Thus, the light yield of $(PPN)_2SbCl_5$ could be estimated to be ~49500 ph $MeV^{-1}$, by referring to LYSO (33200 ph $MeV^{-1}$). The response of $(PPN)_2SbCl_5$ also displayed a well linearity at the low range of X-ray dose rate (FIG. 8C), with a low detection limit of 191.4 $nGy_{air}$ $s^{-1}$, which was much lower than that of LYSO (3.5 $\mu Gy_{air}$ $s^{-1}$) and the requirement for regular medical diagnostics (5.5 $\mu Gy_{air}$ $s^{-1}$). By comparing with some other commercially available scintillators (FIG. 8D), it was found that the X-ray irradiation yield of $(PPN)_2SbCl_5$ was higher than or comparable with existing scintillators, indicating a desirable property for scintillation applications. The remarkable scintillation performance of $(PPN)_2SbCl_5$ could be attributed to its near-unity PLQE and large Stokes shift which resulted in high light yield and less self-absorption of luminescence, respectively.

Figure 8E:
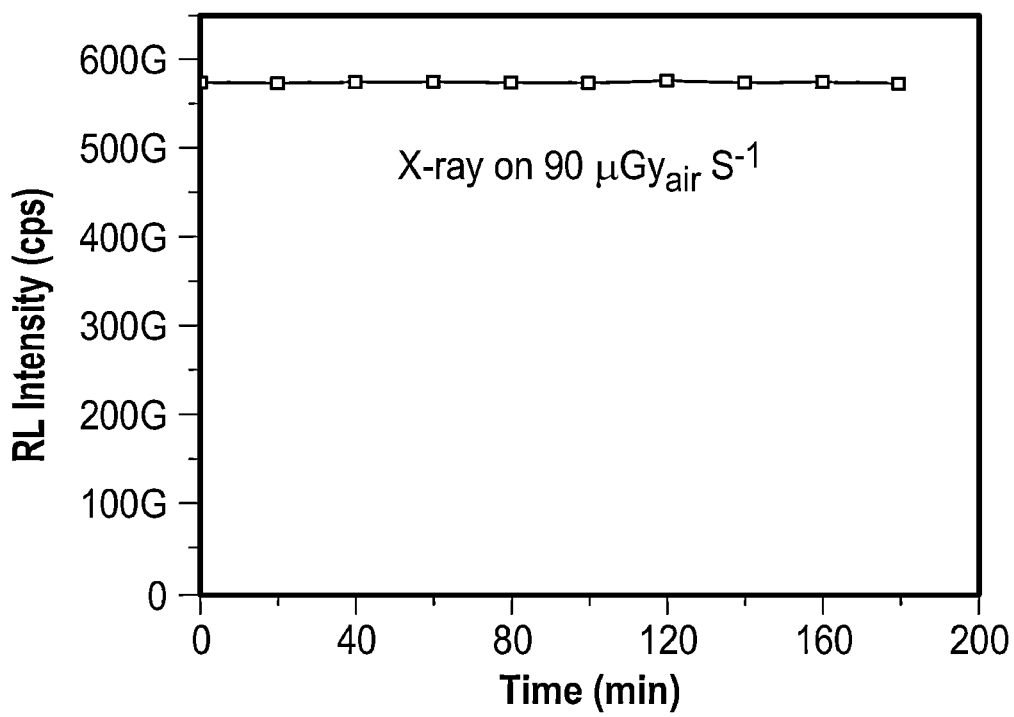
FIG. 8E depicts random laser intensities of an embodiment of a metal halide hybrid at various times from 0 to 180 minutes.
Figure 9A:
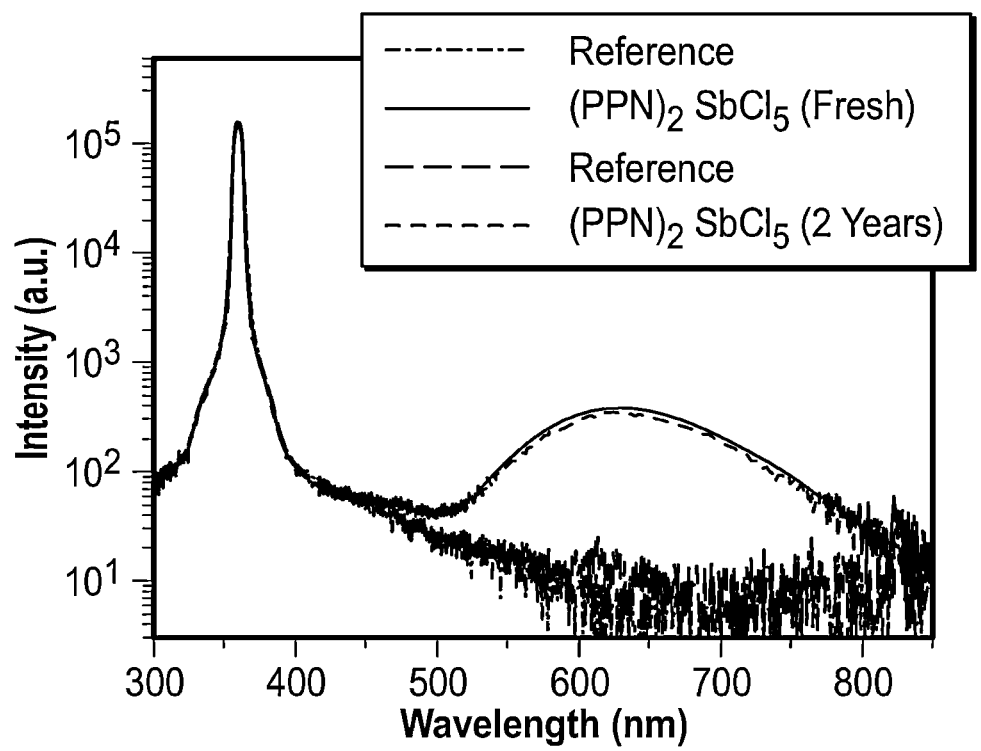
FIG. 9A depicts the intensities of an embodiment of a metal halide hybrid at 0 and 2 years.
Figure 9B:
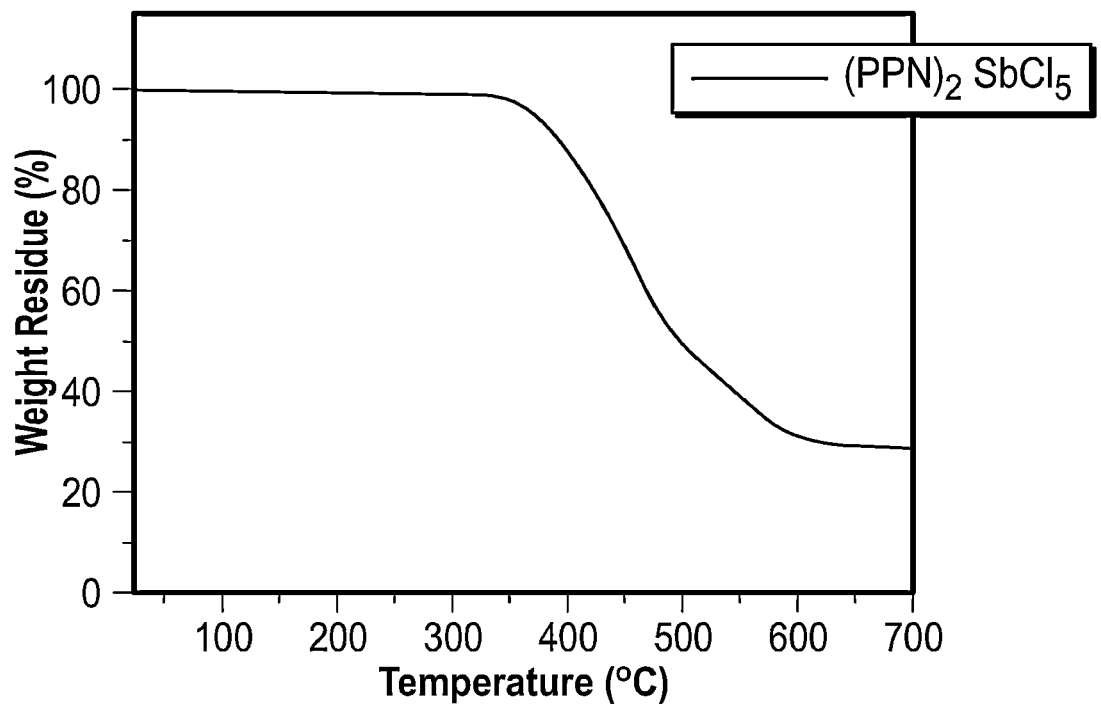
FIG. 9B depicts a thermogravimetric analysis of an embodiment of a metal halide hybrid.

The stability of $(PPN)_2SbCl_5$ was characterized in various aspects. As shown at FIG. 8E, $(PPN)_2SbCl_5$ had almost no light yield degradation upon continuous X-ray irradiation (90 $\mu Gy_{air}$ $s^{-1}$) for two hours. Under high-intensity UV illumination generated by a high-power mercury lamp (150 mW cm 2) for two hours, the PL intensity of $(PPN)_2SbCl_5$ single crystals also remained unchanged. It should be noted that $(PPN)_2SbCl_5$ also exhibited an excellent ambient stability. Single crystals could be kept in the solid state under ambient conditions for two years with little-to-no change of PLQE (FIG. 9A), i.e. the PLQE was 98.1% for fresh $(PPN)_2SbCl_5$ and 97.4% for the same sample after two years' storage. The high stability of $(PPN)_2SbCl_5$ could be attributed to the formation of 0D crystal structure, in which bulky $PPN^+$ can dynamically stabilized the $SbCl_5^{2-}$ pyramids and protected them from outside environment. The thermostability of $(PPN)_2SbCl_5$ crystals was characterized by employing thermogravimetric analysis (TGA in FIG. 9B). The thermal decomposition temperature was measured at more than 300° C., demonstrating high thermostability of $(PPN)_2SbCl_5$ single crystals. All these features suggested the great potential of practical application of this 0D organic metal halide hybrid.

This example demonstrated the development of a novel lead-free X-ray scintillation material, $(PPN)_2SbCl_5$, which could be prepared via a facile solution process to from single crystals with the size of several millimeters. This organic metal halide hybrid adopted a typical 0D structure at the molecular level, with isolated $SbCl_5^-$ anions ionically bonded to surrounding organic cations $PPN^+$. Optical spectroscopic studies showed that $(PPN)_2SbCl_5$ had photo absorption in UV region and exhibited excitation dependent dual-band emissions from both organic and inorganic components. When excited with X-rays, the crystals displayed bright salmon pink luminescence and gave a high scintillation light yield of ~49500 ph $MeV^{-1}$. The response of $(PPN)_2SbCl_5$ scintillator displayed a well linearity at a large range of X-ray dose rate and provided a low detection limit. Moreover, $(PPN)_2SbCl_5$ single crystals exhibited remarkable irradiation, storage, and thermal stabilities. This example suggested a new way to develop low-cost eco-friendly high performance X-ray scintillators.

Growth of $(PPN)_2SbCl_5$ and PPNCl single crystals: PPNCl (1.14 mmol) and $SbCl_3$ (0.57 mmol) were mixed at 2:1 molar ratio and dissolved in 4 mL DCM to form a clear precursor solution. $(PPN)_2SbCl_5$ single crystals were prepared by injecting 0.9 mL $Et_2O$ to 0.5 mL as-prepared precursor solution at room temperature in the $N_2$-filled glovebox and stood for overnight. The large light color crystals were washed with $Et_2O$ and dried under reduced pressure. The preparation of PPNCl single crystals follows above procedures without adding $SbCl_3$.

Characterization: Single crystal X-ray diffraction (SCXRD) data of $(PPN)_2SbCl_5$ was collected by using a Rigaku XtaLAB Synergy-S single crystal X-ray diffractometer with Mo Kα radiation. The crystal was mounted in a cryoloop under Paratone-N oil and cooled to 150 K with an Oxford Cryosystem 800. A crystallographic information file (CIF) of $(PPN)_2SbCl_5$ was deposited with CCDC (No. 1983725). Powder XRD spectrum of $(PPN)_2SbCl_5$ was measured on a Rigaku SmartLab with copper X-ray tube radiation at a voltage of 40 kV and 40 mA. Simulated XRD pattern of $(PPN)_2SbCl_5$ was calculated by Mercury software based on its crystallographic information file (CIF). Thermogravimetric analysis (TGA) was measured by using a TA Instruments TGA 550 system. The samples were heated from room temperature to 700° C. at a rate of 20° C.·$min^{-1}$ in an argon atmosphere. UV-Vis absorption spectrum was carried out using a CARY 5000 UV-Vis NIR spectrophotometer (Agilent Technologies).

Excitation, steady-state photoluminescence (PL), and Time-resolved PL (TRPL) spectra of $(PPN)_2SbCl_5$ were measured on an Edinburgh FS5 spectrofluorometer (Edinburgh Instruments). For TRPL measurement, the excitation was provided by an Edinburgh EPLED-365 picosecond pulsed light emitting diode laser. The decay lifetime was calculated by monoexponential function $y=A_1\times exp(-x/\tau_1)+y_0$. The PL quantum efficiencies (PLQEs) were acquired by using a Hamamatsu Quantaurus-QY Spectrometer equipped with a 150 W xenon lamp, calibrated integrating sphere. The PLQEs were calculated by the equation: $\eta_{QE}=I_S(E_R-E_S)$, in which $I_S$ represented the luminescence emission spectrum of sample, $E_R$ was the spectrum of the excitation light from the empty integrated sphere, and $E_S$ was the excitation spectrum for exciting the sample. Radioluminescence spectra were measured with an Edinburgh FS5 spectrofluorometer equipped with a 4 watts Mini-X2 X-ray tube (AMPTEK, Inc.). The dose rate of the X-ray tube under different power was detected by a Victoreen 450P-SI chamber survey radiation meter. The detection limit was derived as the dose rate when the signal-to-noise ratio was 3. Cerium doped lutetium based scintillator ($Lu_{1.8}Y_{0.2}SiO_5$:Ce, LYSO) was purchased from Jiaxing AOSITE Photonics Technology Co., Ltd. and measured under the same conditions with $(PPN)_2SbCl_5$.

We claim:
1. A method for X-ray scintillation, the method comprising:
  irradiating a metal halide hybrid with high-energy radiation to convert the high-energy radiation to at least one of near ultraviolet light or visible light;
  wherein the metal halide hybrid comprises an organic antimony halide comprising a crystal according to Formula (I)—

$$R_2SbX_5 \qquad \text{Formula (I)},$$

wherein X is a halide, and
wherein R is an organic ammonium cation, wherein the organic ammonium cation has a structure according to formula (IIa) or formula (IIb)—

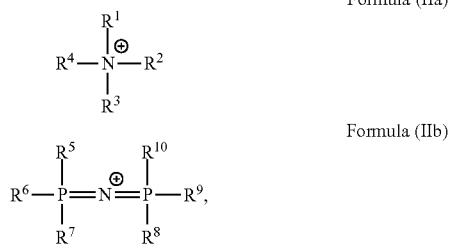

Formula (IIa)

Formula (IIb)

wherein each of $R^1$-$R^{10}$ is independently selected from a substituted or unsubstituted $C_1$-$C_{20}$ hydrocarbyl.

2. The method of claim 1, wherein the organic ammonium cation is of Formula (IIb).

3. The method of claim 1, wherein the organic ammonium cation is a bis(triarylphosphoranylidine)ammonium cation.

4. The method of claim 1, wherein the bis(triarylphosphoranylidine)ammonium cation is bis(triphenylphosphoranylidene)ammonium cation.

5. The method of claim 1, wherein X is Cl.

6. The method of claim 1, wherein the metal halide hybrid has a 0D structure.

7. The method of claim 1, wherein—
(i) the metal halide hybrid has a first PLQE measured within one week of the metal halide hybrid's creation,
(ii) a second PLQE measured after the metal halide hybrid is stored at ambient conditions for at least one year following the metal halide hybrid's creation, and
(iii) the second PLQE is no more than 3 percentage points less than the first PLQE.

8. The method of claim 1, wherein the metal halide hybrid exhibits (i) a light yield of about 70,000 photons/MeV to about 90,000 photons/MeV, (ii) a detection limit of about 50 nGy/s to about 500 nGy/s, or (iii) a combination thereof.

9. The method of claim 1, wherein the metal halide hybrid is in the form of one or more discrete crystals.

10. The method of claim 9, wherein each of the one or more discrete crystals has a largest dimension of about 1 mm to about 10 mm.

11. The method of claim 1, wherein the metal halide hybrid is dispersed in a matrix material.

12. The method of claim 11, wherein the metal halide hybrid is in the form of a powder, and the matrix material comprises a polymer.

13. The method of claim 12, wherein the polymer comprises polydimethylsiloxane.

14. The method of claim 11, wherein the matrix material is in the form of a flexible film.

15. The method of claim 14, wherein the film comprises a polymeric three-dimensional microstructured film.

16. The method of claim 1, wherein the high-energy radiation comprises X-rays, gamma rays, or a combination thereof.

17. A device comprising:
an electronic substrate;
an imaging chip;
a fiber-optic face plate, wherein the imaging chip is arranged between the electronic substrate and the fiber-optic face plate; and
a scintillator screen comprising a metal halide hybrid, wherein the fiber-optic face plate is arranged between the imaging chip and the scintillator screen;
wherein the metal halide hybrid comprises an organic antimony halide comprising a crystal according to Formula (I)—

$R_2SbX_5$    Formula (I), wherein X is a halide, and
wherein R is an organic ammonium cation, wherein the organic ammonium cation has a structure according to formula (IIa) or formula (IIb)—

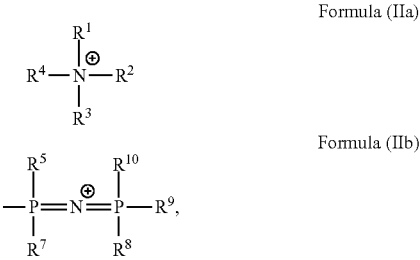

Formula (IIa)

Formula (IIb)

wherein each of $R^1$-$R^{10}$ is independently selected from a substituted or unsubstituted $C_1$-$C_{20}$ hydrocarbyl.

18. A scintillator screen comprising an organic antimony halide, wherein the organic antimony halide comprises a crystal according to Formula (I)—

$R_2SbX_5$    Formula (I), wherein X is a halide, and
wherein R is an organic ammonium cation, wherein the organic ammonium cation has a structure according to formula (IIa) or formula (IIb)—

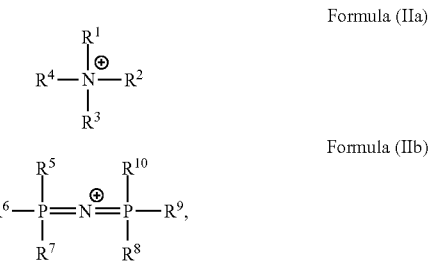

Formula (IIa)

Formula (IIb)

wherein each of $R^1$-$R^{10}$ is independently selected from a substituted or unsubstituted $C_1$-$C_{20}$ hydrocarbyl.

* * * * *